(12) United States Patent
Shirakawa et al.

(10) Patent No.: US 6,380,518 B2
(45) Date of Patent: Apr. 30, 2002

(54) HEAT TREATMENT APPARATUS AND SUBSTRATE PROCESSING SYSTEM

(75) Inventors: Eiichi Shirakawa; Nobuyuki Sata, both of Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/921,139

(22) Filed: Aug. 3, 2001

Related U.S. Application Data

(62) Division of application No. 09/251,731, filed on Feb. 18, 1999, now Pat. No. 6,291,800.

(30) Foreign Application Priority Data

| Feb. 20, 1998 | (JP) | 10-039327 |
| Feb. 20, 1998 | (JP) | 10-039328 |
| Feb. 23, 1998 | (JP) | 10-040246 |

(51) Int. Cl.$^7$ .................................. F27B 5/14
(52) U.S. Cl. ............ 219/390; 219/405; 219/411; 118/724; 118/728; 118/725; 392/416; 392/418
(58) Field of Search ................ 219/390, 405, 219/411; 118/724, 725, 720, 728, 50.1; 392/416, 418

(56) References Cited

U.S. PATENT DOCUMENTS

| 4,976,996 A | 12/1990 | Monkowski et al. |
| 4,993,358 A | 2/1991 | Mahawili |
| 5,108,540 A | 4/1992 | Frijlink |
| 5,244,501 A | 9/1993 | Nakayama et al. |
| 5,244,694 A | 9/1993 | Ozias |
| 5,960,159 A | 9/1999 | Ikeda et al. |
| 6,074,488 A | 6/2000 | Roderick et al. |

*Primary Examiner*—Teresa Walberg
*Assistant Examiner*—Shawntina Fuqua
(74) *Attorney, Agent, or Firm*—Rader, Fishman & Grauer

(57) ABSTRACT

The heat treatment apparatus of the present invention comprises a chamber, a hot plate for supporting and heating a substrate in a chamber, a gas supply mechanism having a single or a plurality of gas blow-out ports and arranged in an upper space above the hot plate in the chamber, for supplying a gas along the substrate so as to cover the substrate placed on the hot plate, and an exhaust mechanism having a single or a plurality of gas converge/exhaust ports which face the gas blow-out ports with the hot plate interposed therebetween, for converging and exhausting the gas blown out from the gas blow-out ports, from the chamber, the gas converge/exhaust ports having an effective exhaustion opening length L2 which is shorter than an effective blow-out opening length L1.

11 Claims, 18 Drawing Sheets

HEAT TREATMENT APPARATUS AND SUBSTRATE PROCESSING SYSTEM

This is a division of application Ser. No. 09/251,731, filed Feb. 18, 1998 now U.S. Pat. No. 6,291,800.

BACKGROUND OF THE INVENTION

The present invention relates to a heat treatment apparatus and a substrate processing system incorporated in a resist coating/developing system for heating or cooling a substrate such as a semiconductor wafer or an LCD (liquid crystal display) substrate.

In a photolithography process for manufacturing a semiconductor device, a photoresist is coated on the substrate and the resist-coated film is exposed to light and developed. The series of processes is carried out in the resist coating/developing system constituted of heating units such as a prebake unit and a post bake unit. Each of these heating units has a hot plate having a built-in heater of a resistance heating type. In the peripheral portion of the hot plate, a plurality of small projections are provided. The substrate is supported by these small projections, so that a small space is created between the substrate and the hot plate. The substrate is heated by receipt of heat radiation (heat energy beams) emitted from the hot plate.

At this time, air around the hot plate is heated and raised in temperature. The hot air thus heated rises up within a chamber and exhausted through an exhaust port formed through-an upper cover. The hot air comes into an ascending air stream which flows from the outer peripheral portion of the hot plate toward the center and is converged and exhausted from a position right above the substrate. As a result, part of particles contained in the air may fall down on the substrate, causing a problem of particle adhesion.

In addition a conical-form recess is formed around the exhaust port in the lower surface portion of the cover. The hot air is guided along the conical-form recess, formed into a spiral air stream and flows toward the exhaust port. However, the flow of the hot air tends to stagnate near right below the exhaust port. The stagnant hot air has a thermal influence upon the wafer W, rendering temperature of the wafer W non-uniform.

Furthermore, the height from the floor to the ceiling of the clean room is limited to a certain range. Therefore, it is necessary to reduce the height of the apparatus. However, a conventionally-used heat treatment apparatus has the upper cover, so that the height of the apparatus is large.

BRIEF SUMMARY OF THE INVENTION

An object of the present invention is to:provide a small heat treatment apparatus capable of heating a substrate uniformly while preventing particles from being attached to the substrate.

The heat treatment apparatus according to the present invention comprises:
a chamber;
a hot plate for supporting and heating a substrate in a chamber;
a gas supply mechanism having a single or a plurality of gas blow-out ports and arranged in an upper space above the hot plate in the chamber, for supplying a gas along the substrate so as to cover the substrate placed on the hot plate; and
an exhaust mechanism having a single or a plurality of gas convergent exhaust ports which face the gas blow-out ports with the hot plate interposed therebetween, for converging and exhausting the gas blown out from the single or the plurality of gas blow-out ports, from the chamber, the single or the plurality of the gas convergent exhaust ports having an effective exhaustion opening length L2 which is shorter than an effective blow-out opening length L1.

The heat treatment apparatus further comprises a control section for controlling the gas supply mechanism and the exhaust mechanism to form gaseous streams which flow in substantially parallel to an upper surface of the substrate from the single or the plurality of gas blow-out ports to the single or the plurality of gas convergent exhaust ports, in the upper space above the substrate.

The exhaust mechanism has two convergent exhaust ports arranged at a distance, and further comprising a switching mechanism for switching exhaust operation between the two convergent exhaust ports.

The gas blow-out ports consist of a plurality of holes arranged lengthwise along a linear pipe which is at least longer than a diameter of the substrate, and
the convergent exhaust ports consists of at least three convergent exhaust holes arranged so as to face the linear pipe at an equal distance from the linear pipe;

The heating treatment apparatus further comprises switching means for switching the exhaust operation between the at least three exhaust holes.

Furthermore, the heat treatment apparatus comprises an open/shut mechanism for opening and shutting the convergent exhaust holes individually.

The control section selects some holes from the convergent exhaust holes and instructs the open/shut mechanism to open the convergent exhaust holes selected.

The heat treatment apparatus further comprises a parallel moving mechanism for moving the convergent exhaust holes in parallel with the linear pipe.

The control section controls operation of the switching mechanism to gradually switch gaseous-steam directions from the gas blow-out ports toward the convergent exhaust holes.

The heat treatment apparatus further comprises exhaust port moving means for moving the convergent exhaust ports along the gas blow-out ports so as to continuously switch the gaseous-stream directions from the gas blow-out ports toward the convergent exhaust ports.

The chamber has upper and lower surfaces substantially closed and a lateral surface having an opening formed therein for loading/unloading the substrate.

The heat treatment apparatus according to the present invention comprises:
a chamber;
a hot plate for supporting and heating a substrate in the chamber;
a first pipe having a single or a plurality of gas blow-out ports for supplying a gas along the substrate so as to cover the substrate placed on the hot plate in an upper space above the hot plate in the chamber;
first and second exhaust ports facing both ends of the first pipe with the hot plate interposed therebetween;
a second pipe interposed between the first and second exhaust ports;
a third and fourth exhaust ports facing both ends of the second pipe with the hot plate interposed therebetween, the first pipe being arranged between the third and fourth exhaust pipes;
a gas supply system communicating with the first and second pipes for supplying a gas to each of the first and second pipes;

an exhaust system communicating with the first, second, third, and fourth exhaust ports, for exhausting the gas through each of the exhaust ports;

a first switching unit for selectively switching the communication between one of the first and second pipes and the gas supply system;

a second switching unit for selectively switching the communication between either a pair of the first and second exhaust ports or a pair of the third and fourth exhaust ports, and the exhaust system; and a control section connected to the first and second switching units, for alternately switching a first connection state for flowing the gas from the first pipe to the first exhaust port with a second connection state for flowing the gas from the first pipe to the second exhaust port, and for alternately switching a third connection state for flowing the gas from the second pipe to the third exhaust port with a fourth connection state for flowing the gas from the second pipe to the fourth exhaust port, as well as for alternately switching a first and second connection state with the second switching means.

The heat treatment apparatus according to the present invention comprises:

a chamber;

a hot plate for supporting and heating a substrate in the chamber;

gaseous stream formation means for supplying a gas along the substrate so as to cover the substrate placed on the hot plate and for exhausting the gas, thereby forming a gas flowing region in a triangle or trapezoid form in an upper space above the hot plate in the chamber, in a plan view; and gaseous stream switching means for switching a directions of gaseous streams formed by the gaseous stream formation means.

The gaseous stream formation means comprises three porous pipes for blowing out the gas in successive different directions which differ by an angle of 120°;

means for switching supply of the gas to the three porous pipes; and exhaust ports each facing the corresponding porous pipe with the hot plate interposed therebetween.

In this case, each of the three porous pipes is formed straight and arranged in the triangular form so as to surround the hot plate; and the exhaust ports are located respectively at three apexes of the triangle formed of the porous pipes.

Furthermore, in this case, three porous pipes each having an arc shape and arranged in a ring form so as to surround the hot plate in a plan view; and the exhaust ports are positioned at three joints between the porous pipes.

The gaseous stream formation means has four porous pipes for blowing out the gas in successive directions which differ by an angle of 90°, means for switching gas supply to the four porous pipes, and exhaust ports each facing the corresponding porous pipe with the hot plate interposed therebetween.

The four porous pipes each being formed straight and arranged in a square form so as to surround the hot plate, in a plan view, and the exhaust ports are positioned respectively at four apexes of the square formed of the porous pipes.

The four porous pipes each having an arc shape and arranged in a ring form so as to surround the hot plate, in a plan view, and the exhaust ports are positioned respectively at four joints of the ring formed of the porous pipes.

The gaseous stream formation means comprises a circular rail concentrically arranged around the hot plate;

an arc form pipe moving on the circular rail for blowing out the gas inwardly to a center of the hot plate;

an exhaust port member moving on the circular rail, for exhausting the gas; and moving means for synchronously moving the exhaust port member and the arc-shape pipes with the hot plate interposed therebetween.

The heat treatment apparatus according to the present invention comprises:

a chamber;

a hot plate for supporting and heating a substrate in the chamber;

an exhaust mechanism having a single or a plurality of exhaust ports for exhausting a gas in a direction substantially parallel to a main surface of the substrate placed on the hot plate;

a gas supply mechanism facing the exhaust ports with the hot plate interposed therebetween and having gas blow-out ports whose total length involved in blowing out of the gas is greater than that of the exhaust ports; and an air board for guiding the gas blown out from the gas brow-out ports to the exhaust ports.

The air board consists of a first board member extended from an end of an array of gas blow-out ports to an end of an array of the exhaust ports, and a second board member extended from the other end of the array of the gas blow-out ports and the other end of the array of the exhaust ports.

Furthermore, the heat treatment apparatus of the present invention comprises:

a sensor for detecting temperature of the hot plate; and control means for controlling at least one of the gas supply mechanism and the exhaust mechanism on the basis of the temperature detected by the sensor.

The substrate processing system according to the present invention comprises:

a chamber;

a hot plate for supporting and heating a substrate in the chamber;

an exhaust mechanism having a single or a plurality of exhaust ports for exhausting a gas substantially in parallel with a main surface of the substrate placed on the hot plate;

a gas supply mechanism facing the exhaust ports with the hot plate interposed therebetween and having a gas blow-out ports whose total length involved in blowing out of the gas is greater than that of the exhaust ports;

a housing having triangular-prism corner assemblies each having a triangular bottom surface whose apex corresponds to the exhaust port and whose bottom line corresponds to the gas blow-out ports, for surrounding the hot plate;

a plurality of heat treatment units symmetrically arranged in the housing;

a main arm mechanism surrounded by the heat treatment units, for transporting the substrate to each of the heat treatment units; and control means for controlling the main arm mechanism and the heat treatment units, independently.

The heat treatment units consist of four units each being arranged at a corner of the chamber in a plan view.

The most inner part of each of the corner assemblies is formed with a right angle in a plan view and the exhaust port is arranged in the most inner part.

According to the present invention, air streams containing dust lost their speed in front of the exhaust ports, it is possible to prevent the dust from falling on the substrate to form particles. In addition, it is possible to prevent non-uniform heating of the substrate without causing stagnation of the air on the substrate. Furthermore, it is possible to reduce the height of the treatment apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferred embodiments of the present invention will be explained with reference to the accompanying drawings.

Figure 1:
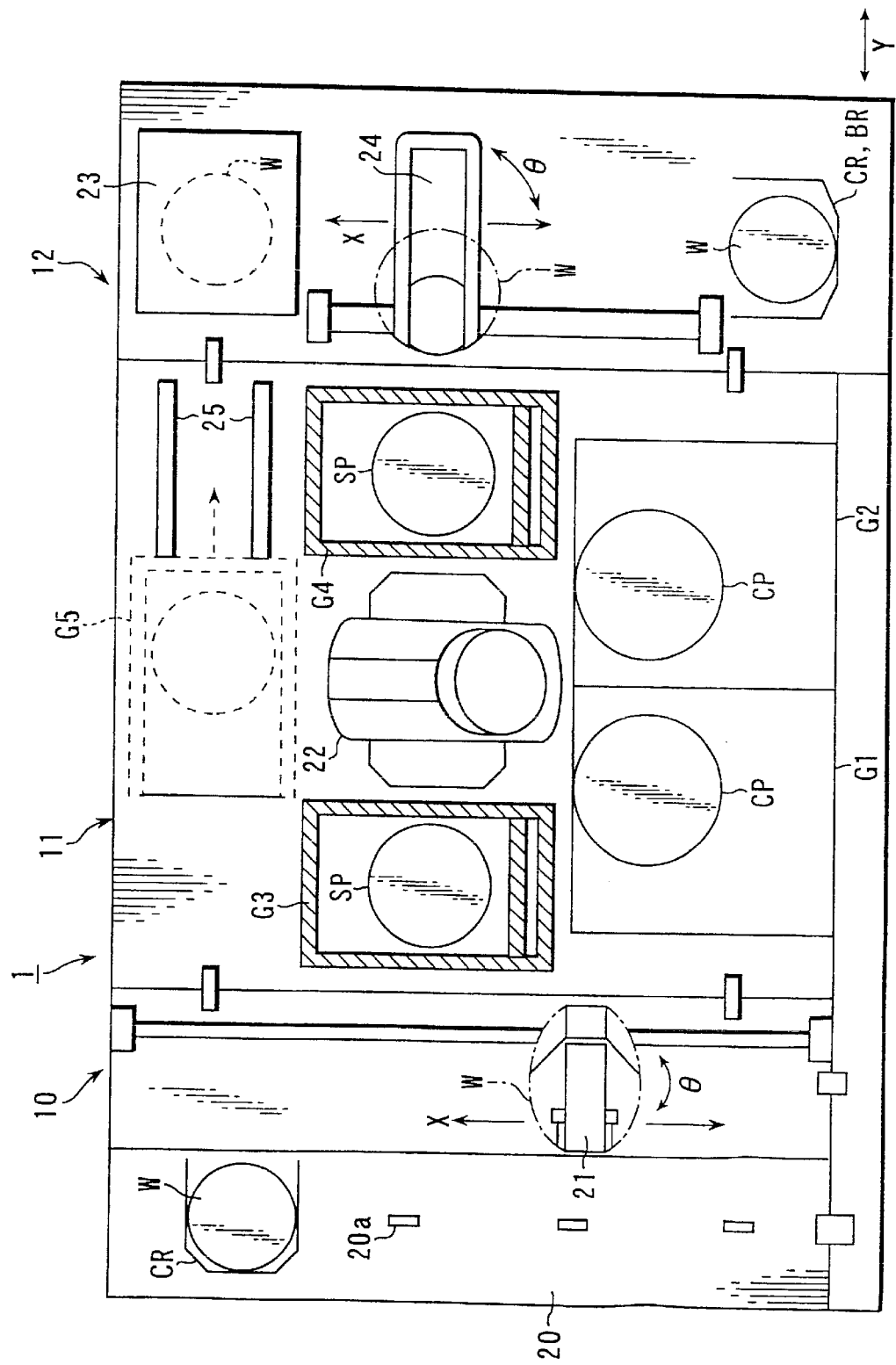
FIG. 1 is a schematic plan view of a resist coating/developing system.
Figure 2:
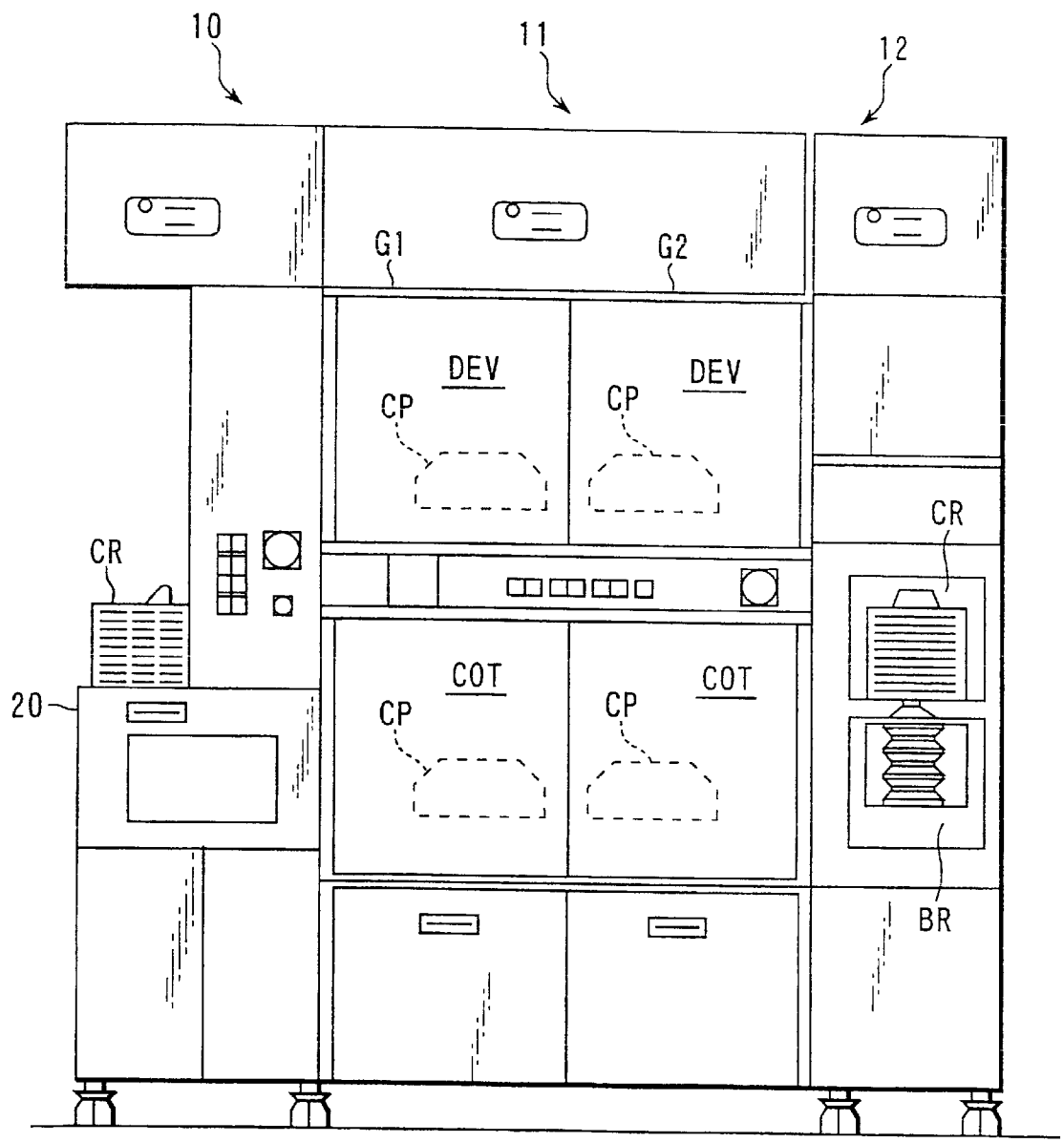
FIG. 2 is a schematic front view of the resist coating/developing system.
Figure 3:
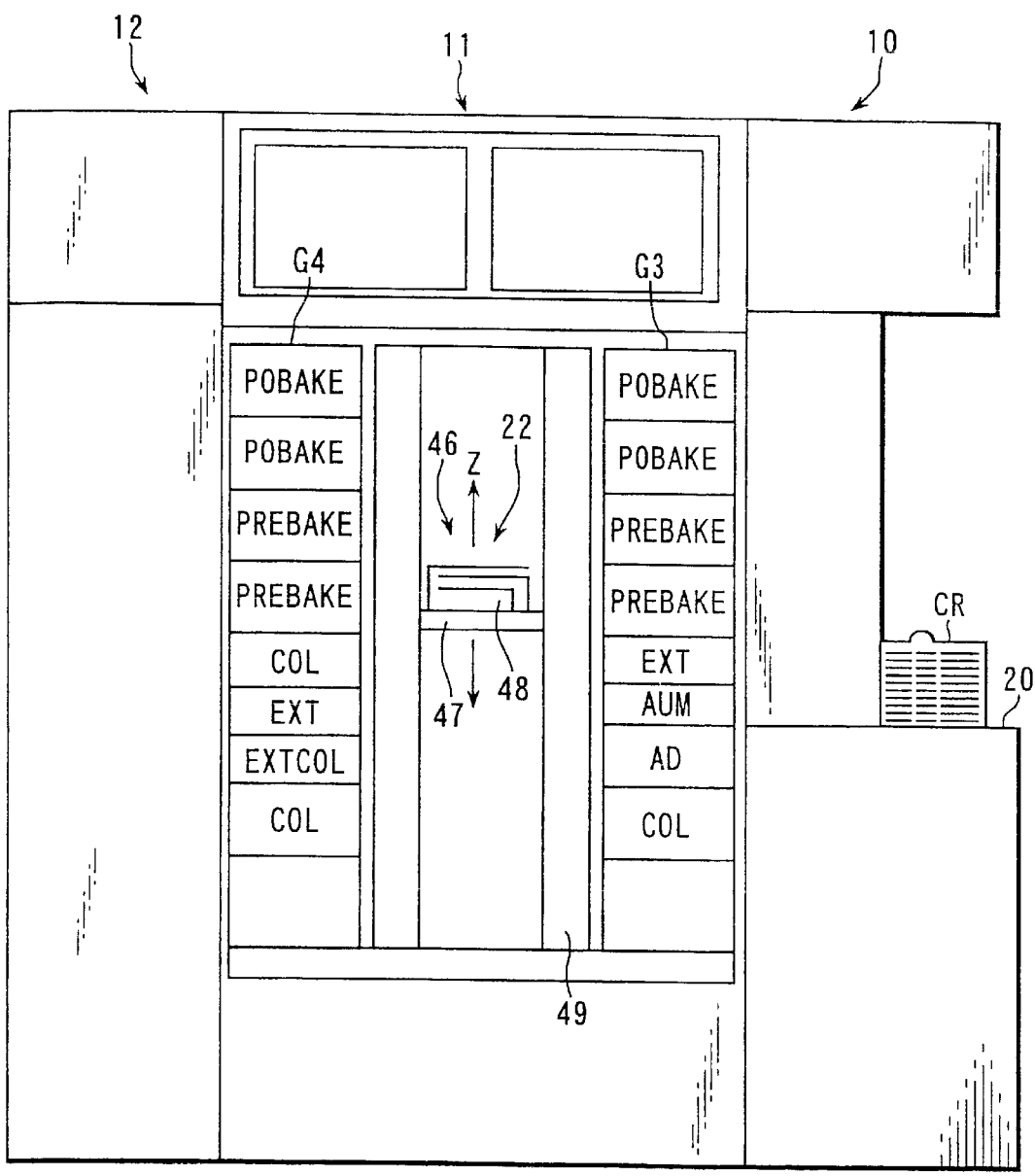
FIG. 3 is a schematic back view of the resist coating/developing system.

As shown in FIGS. 1 to 3, a coating/developing system 1 has a load/unload section 10, a process section 11, and an interface section 12. The load/unload section 10 has a cassette table 20 on which cassettes CR each storing e.g., 25 semiconductor wafers W, are loaded/unloaded. The process section 11 has various single wafer processing units for processing wafers W sequentially one by one. The interface section 12 is interposed between the process section 11 and a light-exposure apparatus (not shown).

Four projections 20a are formed on the cassette table 20. Four cassettes CR are positioned respectively at right places to the process section 11 by means of these projections 20a. Each of the cassettes CR mounted on the table 20 has a load/unload opening facing the process section 11.

In the load/unload section 10, a first sub-arm mechanism 21 is formed which is responsible for loading/unloading the wafer W into/from each cassette CR. The first sub arm mechanism 21 has a holder portion for holding the wafer W, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a θ rotation mechanism (not shown) for swinging the holder portion around the Z-axis.

The first sub-arm mechanism 21 can gain access to an alignment unit (ALIM) and an extension unit (EXT) belonging to a third process unit group G3.

As shown in FIG. 3, a main arm mechanism 22 is liftably arranged at the center of the process section 11. Five process units G1–G5 are arranged around the main arm mechanism 22. The main arm mechanism 22 is arranged within a cylindrical supporting body 49 and has a liftable wafer transporting apparatus 46. The cylindrical supporting body 49 is connected to a driving shaft of a motor (not shown). The driving shaft can be rotated about the Z-axis in synchronism with the wafer transporting apparatus 46 by an angle of θ. The wafer transporting apparatus 46 has a plurality of holder portions 48 movable in a front and rear direction of a transfer base table 47.

Units belonging to first and second process unit groups G1, G2, are arranged at the front side of the system 1. Units belonging to a third process unit group G3 are arranged next to the load/unload section 10. Units belonging to a fourth process unit group G4 are arranged next to the interface section 12. Units belonging to a fifth process unit group G5 are arranged at a back side of the system 1.

As shown in FIG. 2, the first process unit group G1 has two spinner-type process units for applying a predetermined treatment to the wafer W mounted on a spin chuck within the cup CP. In the first process unit G1, for example, a resist coating unit (COT) and a developing unit (DEV) are stacked in two stages sequentially from the bottom. In the second process unit group G2, two spinner type process units such as a resist coating unit (COT) and a developing unit (DEV), are stacked in two stages sequentially from the bottom. The resist coating unit (COT) is preferably set at a lower stage than the developing unit (DEV). This is because a discharge line for the resist waste solution is desired to be shorter than a developing waste solution since the resist waste solution is more difficult to discharge than the developing waste solution. However, if necessary, the resist coating unit (COT) may be arranged at the upper stage than the developing unit (DEV).

As shown in FIG. 3, the third process unit group G3 has a cooling unit (COL), an adhesion unit (AD), an alignment unit (ALIM), an extension unit (EXT), a prebaking unit (PREBAKE), and postbaking unit (POBAKE). These units are stacked sequentially from the bottom.

Similarly, the fourth process unit group G4 has a cooling unit (COL), an extension cooling unit (EXTCOL), an extension unit (EXT), a cooling unit (COL), a prebaking unit (PREBAKE) and a postbaking unit (POBAKE). They are stacked sequentially from the bottom.

As mentioned, it is preferable that the cooling unit (COL) and the extension cooling unit (EXTCOL) to be operated at low processing temperatures, be arranged at lower stages and the baking unit (PREBAKE), the postbaking unit (POBAKE) and the adhesion unit (AD) to be operated at high temperatures, be arranged at the upper stages. With this arrangement, thermal interference between units can be reduced.

At the front side of the interface section 12, a movable pick-up cassette CR and an non-movable buffer cassette BR are arranged in two stages. At the back side of the interface section 12, a peripheral light exposure apparatus 23 is arranged. At the center portion of the interface section 12, a second sub-arm mechanism 24 is provided, which is movable independently in the X and Z directions, and which is capable of gaining access to both cassettes CR and BR and the peripheral light exposure apparatus 23. In addition, the second sub-arm mechanism 24 is rotatable around the Z-axis by an angle of θ and is designed to be able to gain access not only to the extension unit (EXT) belonging to the fourth processing unit G4 but also to a wafer transfer table (not shown) near the light exposure apparatus (not shown).

In the system 1, the fifth processing unit group G5 can be arranged at the back side of the main arm mechanism 22. The fifth processing unit G5 can be slidably shifted in the Y-axis direction along a guide rail 25. Since the fifth processing unit group G5 can be shifted as mentioned, maintenance operation can be applied to the main arm mechanism 22 easily from the back side.

Figure 4:
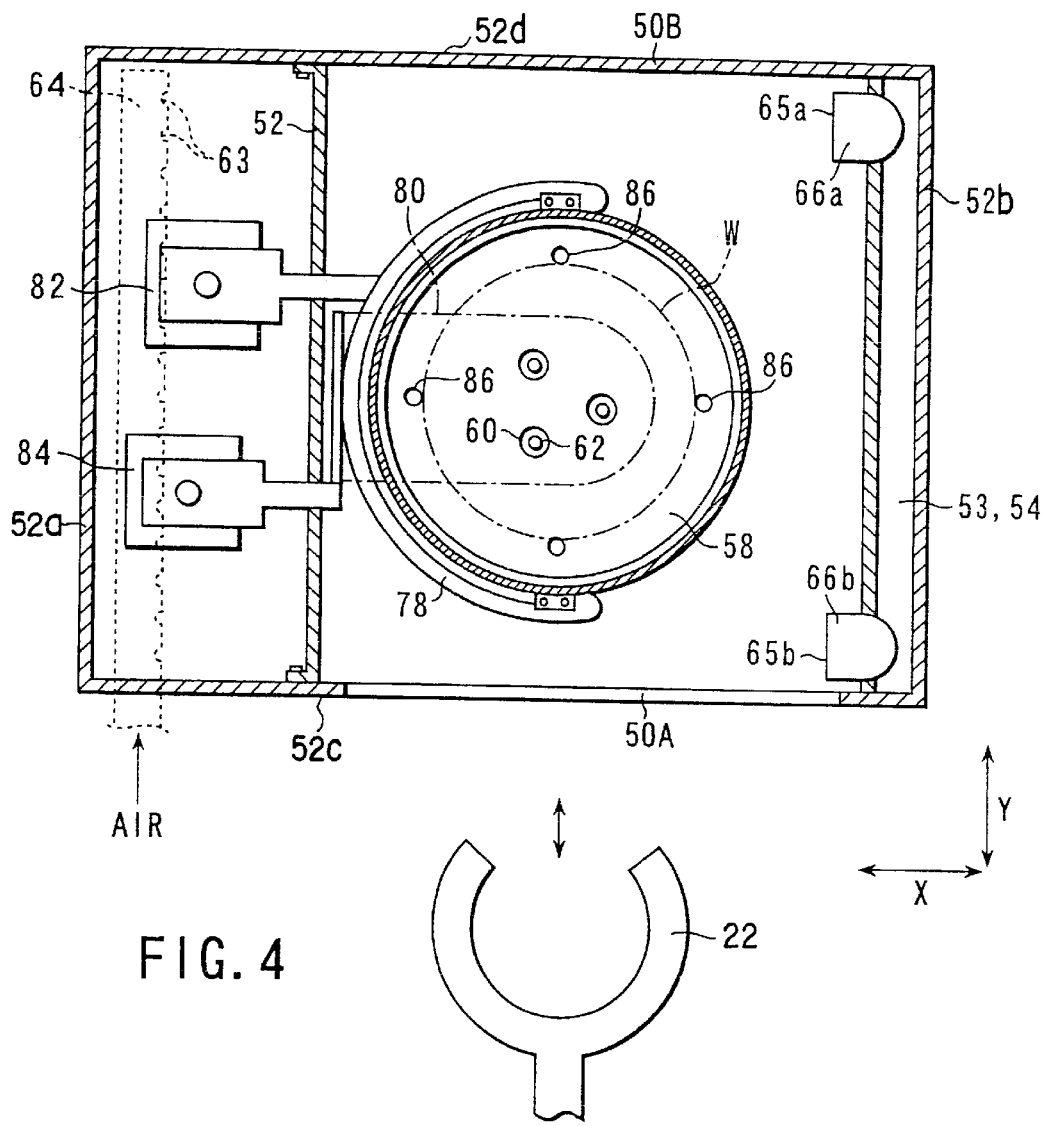
FIG. 4 is a perspective sectional view of a heat treatment apparatus according to Embodiment 1 of the present invention, as viewed from the upper side.
Figure 5:
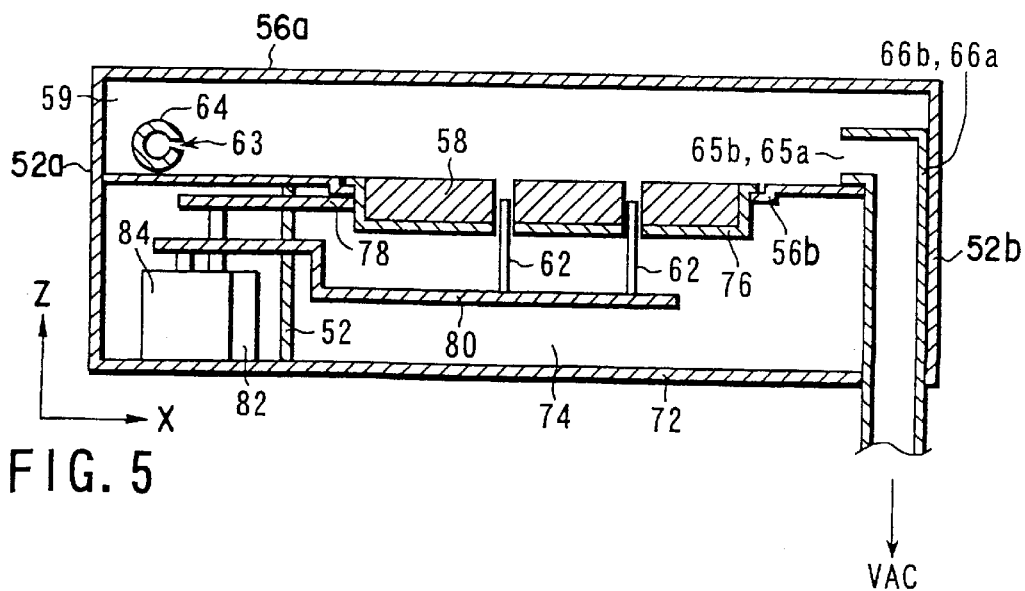
FIG. 5 is a perspective sectional view of the heat treatment apparatus according to Embodiment 1 of the present invention, as viewed from the lateral side.
Figure 6:
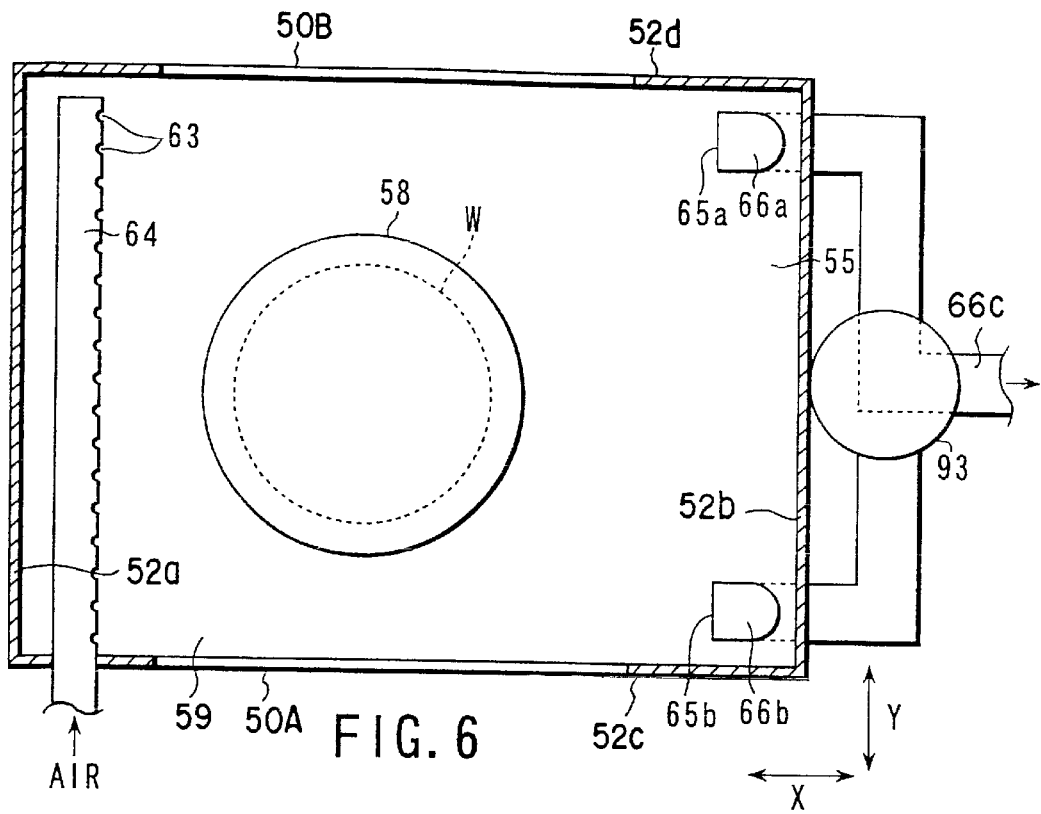
FIG. 6 is a perspective sectional view of the heat treatment apparatus according to Embodiment 1, whose upper portion is partially broken away.

Now, referring to FIGS. 4 and 5, we will explain the prebaking unit (PREBAKE) and the postbaking unit (POBAKE) belonging to the third and fourth process units $G_3$, $G_4$.

The prebaking unit (PREBAKE) is a heat treatment apparatus for heating a photoresist film to at least higher temperature than room temperature before subjecting to the light exposure process. The postbaking unit (POBAKE) is a heat treatment apparatus for heating the photoresist film to at least higher temperature than room temperature after the light exposure. The chamber 52 of each of the heat treatment apparatuses has a inoperable ceiling 56a, an openable closed floor 56b. Although lateral walls 52a, 52b are inoperable, lateral walls 52c and 52d are openable.

A hot plate 58 is fitted at a center opening of the chamber floor 56 and supported by a supporting plate 76. The hot plate 58 has three holes 60 threading through it. Three lift pins 62 are inserted into the corresponding three holes 60. Three lift pins 62 are connected to and supported by an arm 80, which is further connected to and supported by a rod 84a of a vertical cylinder 84. When the rod 84a is allowed to protrude from the cylinder 84, the lift pins 62 protrude from the hot plate 58, thereby lifting the wafer W.

A linear pipe 64 is arranged horizontally along the first lateral wall 52a. The linear pipe 64 extends in the Y-axis direction and communicates with a supply port of a gas (air) supply system 91. A plurality of nozzle holes 63 are arranged lengthwise along the linear pipe 64. Air or a nitrogen gas is blown out almost horizontally from each of the nozzle holes 63.

Two exhaust pipes 66a and 66b thread through the second lateral wall 52b. Openings of the exhaust ports 65a, 65b are thus present within the chamber 52. Each of the exhaust ports 65a, 65b faces to the nozzle holes 63 of the linear pipe 64. Each of two exhausting pipes 66a, 66b communicates with the exhaust system 92 via a switching unit 93. The exhaust port 65a is arranged at one of the corners formed of the lateral walls 52b and 52d. The exhaust port 65b is arranged at another corner formed of the lateral walls 52b and 52c. The distance between the exhaust ports 65a and 65b is nearly equal to the length of the linear pipe 64.

The opening diameters and shapes of all nozzle holes 63 may be identical or not identical. More specifically, the opening diameter of the nozzle hole 63 may be the smallest at the center portion of the pipe 64 and gradually increased toward the right and left end portions of the pipe 64. Conversely, the opening diameter of the nozzle hole 63 may be the largest at the center portion of the pipe 64 and gradually decreased toward the right and left end portions of the pipe 64. Alternatively, a structure capable of changing the opening diameter and a gas flow-out angle of each of the nozzle holes 63, may be employed.

The gas flow-out angle of the nozzle holes 63 may be changed by inclining the nozzle holes 63 present at the center of the longitudinal direction of the pipe 64 toward the exhaust port 65a or 65b in place of proceeding straight. If so, the gas can be prevented from hitting directly upon the hot plate 58 close to the linear pipe 64.

Furthermore, the gas supply system 91 and an exhaust system 92 may be controlled on the basis of the detected temperature of the hot plate 58. For example, when the detected temperature of the hot plate 58 is extremely low, operations of the gas supply system 91 and the evacuation system 92 are independently controlled to prevent the decrease in temperature of the hot plate.

A ring form shutter (not shown) is attached so as to surround the hot plate 58. Loading/unloading ports 50A, 50B are formed in the chamber lateral walls 52c, 52d, respectively. The wafer W is loaded into and unloaded from the chamber 52 by the main arm mechanism 22 through the loading/unloading port 50A, 50B after the shutter is opened.

The shutter (not shown) is liftably supported by a cylinder 82 via an arm 78. The shutter is positioned at a stand-by position lower than the hot plate 58 during non-operation time, whereas, during operation time, it is lifted up to a position higher than the hot plate 58 and shuts up the openings 50A, 50B. When the shutter 66 is lifted up, nitrogen gas or air blows out from the holes 63 of the pipe 64 into an upper space 59 of the chamber.

As shown in FIG. 5, the exhausting pipes 66a, 66b thread through a chamber floor 56b and a bottom plate 72 and extend downwards. A machine chamber 74 is arranged below the chamber floor 56b. The machine chamber 74 is defined by the chamber floor 56b, lateral walls 52a, 52b, 52c, 52d and the bottom plate 72. The machine chamber 74 houses a hot plate supporting board 76, a shutter arm 78, lift pin arm 80, and liftable cylinders 82, 84.

Next, referring to FIG. 7, a control system of the heat treatment apparatus will be explained.

A heater 96 consisting of a resistance heating type is buried in the hot plate 58. The heater 96 is connected to a power supply source (not shown) housed in a controller 94. The hot plate 58 is equipped with a sensor 97. Temperature of the hot plate 58 is detected by the sensor 97 and a signal of the detected temperature is input into the controller 94. The controller determines how much power should be supplied to the heater 96 on the basis of the temperature detection signal thus input. As the sensor 97, a thermocouple and a platinum resistance heater (Pt sensor) may be used alone or in combination thereof. Alternatively, the substrate W may be heated by circulating a vaporized heat medium within the hot plate 58, in place of the resistance heater.

The gas supply system 91 has a gas (air) inlet port (not shown) for introducing a gas (air) from a clean room, a filter (not shown) for removing an alkaline composition such as ammonia from the air, a filter (not shown) for removing particles from the air, a ventilation fan (not shown), and a gas supply port communicating with the pipe 64 (not shown). A power supply switch for the fan is connected to the controller 94. The linear pipe 64 extends straight in parallel with the chamber wall 52a. A plurality of holes 63 are formed lengthwise along the pipe 64. These holes 63 are arranged longitudinally in line along the pipe 64 and responsible for flowing out the air horizontally therefrom.

The exhaust system 92 has an inlet port (not shown) for sucking the hot air of the chamber 52, an exhaust blower (not shown), and either a plant intensive exhaust unit (not shown) or an exhaust port (not shown) communicating with the gas supply system 91. When a circulation route is formed so as to communicate with the exhaust port of the exhaust system. 92 and a gas inlet port of the gas supply system 91, a heat exchanger (not shown) is attached to the circular route to cool the hot air. The withdraw port of the exhaust system 92 is communicated with two exhaust pipes 66a, 66b via the switching unit 93. The exhaust pipe 66a threads through the chamber wall 52b and the exhaust port 65a of the pipe 66a is present at one of the corners of the chamber 52. The exhaust pipe 66b threads through the chamber wall 52b and the exhaust port 65b of the pipe 66b is present at the other corner of the chamber 52.

The switching unit 93 has a confluence pipe 66c having passages each communicating with the exhaust pipes 66a and 66b, and a switch damper (not shown). A power switch of the-drive section for the switch damper is connected to the controller 94.

Figure 7:
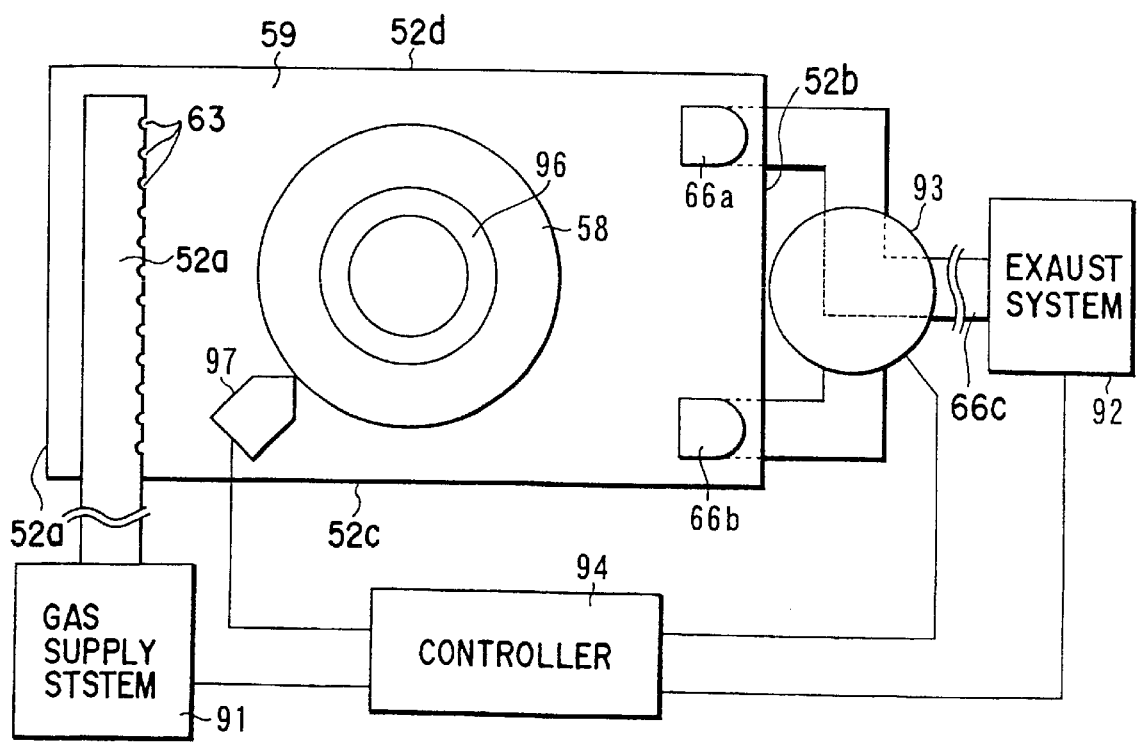
FIG. 7 is a block diagram showing a control system of the heat treatment apparatus according to Embodiment 1.

The controller 94, which is not shown in FIG. 7, is connected to both a power supply switch of the driving motor 84 for moving the lift pins 62 and a power supply switch (not shown) for an open/shut driving cylinder for the shutters 50A, 50B. Furthermore, a keyboard (not shown) for data input is connected to an input portion of the controller 94, for inputting data of heat treatment conditions for each lot.

Figure 8:
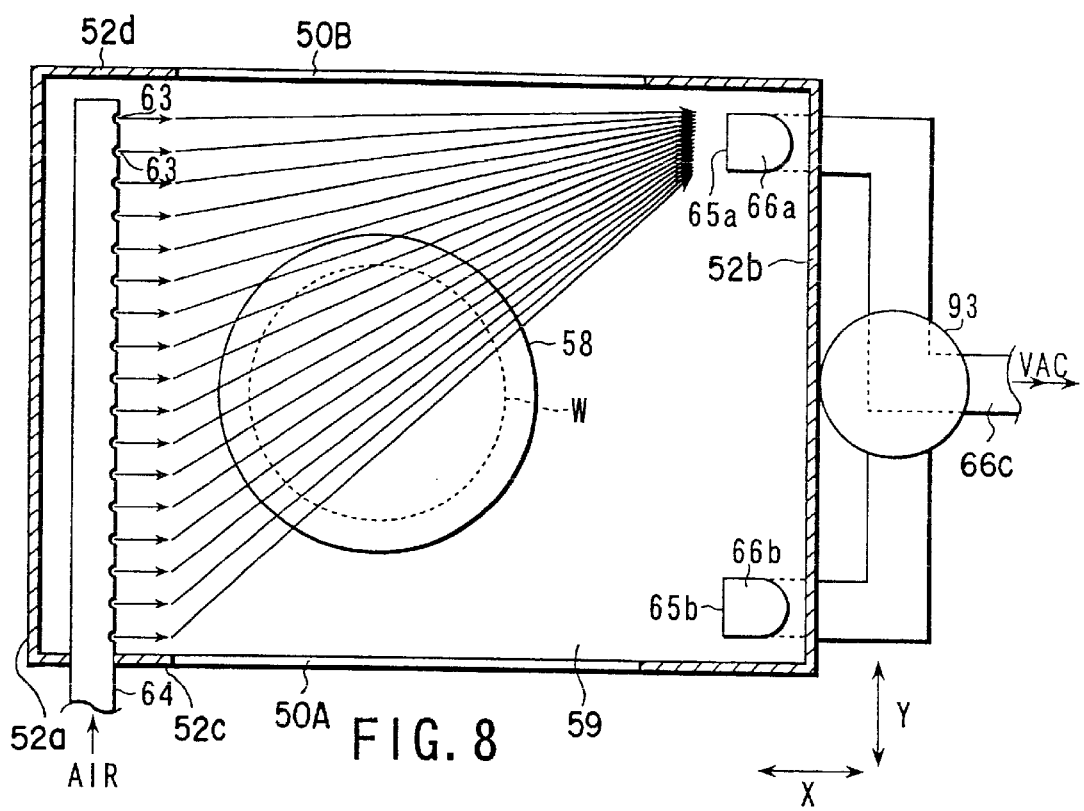
FIG. 8 is a schematic plan view showing air streams within the heat treatment apparatus of Embodiment 1.
Figure 9:
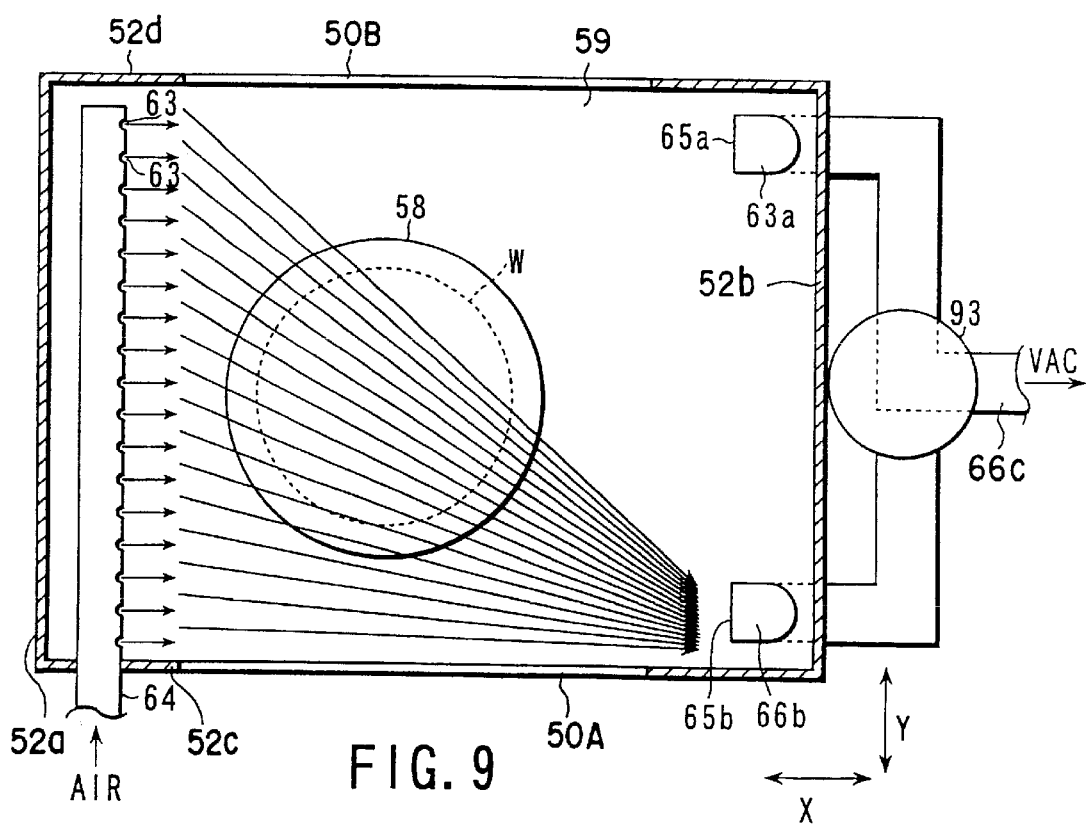
FIG. 9 is another schematic plan view showing air streams within the heat treatment apparatus according to Embodiment 1.

Now, referring to FIGS. 8 and 9, we will explain the case where the photoresist film coated on the wafer W is treated with heat by using the heat treatment, apparatus.

When a main switch of the coating/developing system 1 is turned on, power is initiated to supply to each heating unit from the corresponding power source. When the hot plate 58 becomes stable at a predetermined temperature, the wafer W is transported by the main arm mechanism 22 to the prebaking unit. The surface of the wafer W is coated with photoresist. The arm holder 22a is inserted into the chamber 52 after the shutter is opened. The pin 62 is then moved up to transfer the wafer W from the arm holder 22a onto the pins 62. Then, the arm holder 22a is withdrawn from the chamber 52 and the pins 62 are moved down to place the wafer W on the hot plate 58. At this time, the controller 94 controls the heater 96 in such a way that the hot plate 58 is set at a desired temperature, on the basis of the detection signal sent from the sensor 97. In this manner, the hot plate 58 is maintained at, for example, 120° C. When the temperature detected by the sensor 97 is beyond an acceptable range, the power supply to the heat 96 is controlled or a flow amount and rate of the air (gas) sent from the pipe 64 toward the hot plate 58 are controlled.

Subsequently, operations of the gas supply system 91 and the exhaust system 92 are individually initiated thereby forming gaseous streams from the first lateral wall 52a toward the second lateral wall 52b. The gaseous streams flow almost horizontally in the upper space 59 and move differently if the functioning exhaust port is switched. More specifically, gaseous streams from the linear pipe 64 toward the first exhaust port 65a are formed as shown in FIG. 8. When the flow route of exhaust air is switched from the first exhaust pipe 66a to the second exhaust pipe 66b by the switching unit 93, gaseous streams from the linear pipe 64 toward the second exhaust port 65b are formed as shown in FIG. 9. As described, the flow route of the exhaust is switched by the switching unit 93 between the first exhaust pipe 66a and the second exhaust pipe 66b at predetermined time intervals.

The air stream obtained by changing the exhaust ports alternately is called as "virtually parallel streams flowing in the X-axis direction". Since the "virtually parallel streams" are formed in the upper space 59, heat can be given from the hot plate 58 to the wafer W uniformly, applying the treat treatment uniformly over the upper surface of the wafer W.

According to the heat treatment apparatus of this embodiment, even if particles are mixed in the air stream, the gaseous streams do not slow down in speed nor stagnate. The particles therefore do not fall onto the wafer W, with the result that contamination of the wafer W with the particles adhesion is avoided.

According to the heat treatment apparatus of this embodiment, the space 59 above the hot plate 58 can be narrowed. Therefore the size of the apparatus in the Z-axis direction can be reduced, contributing to miniaturization of the heat treatment apparatus.

Figure 10:
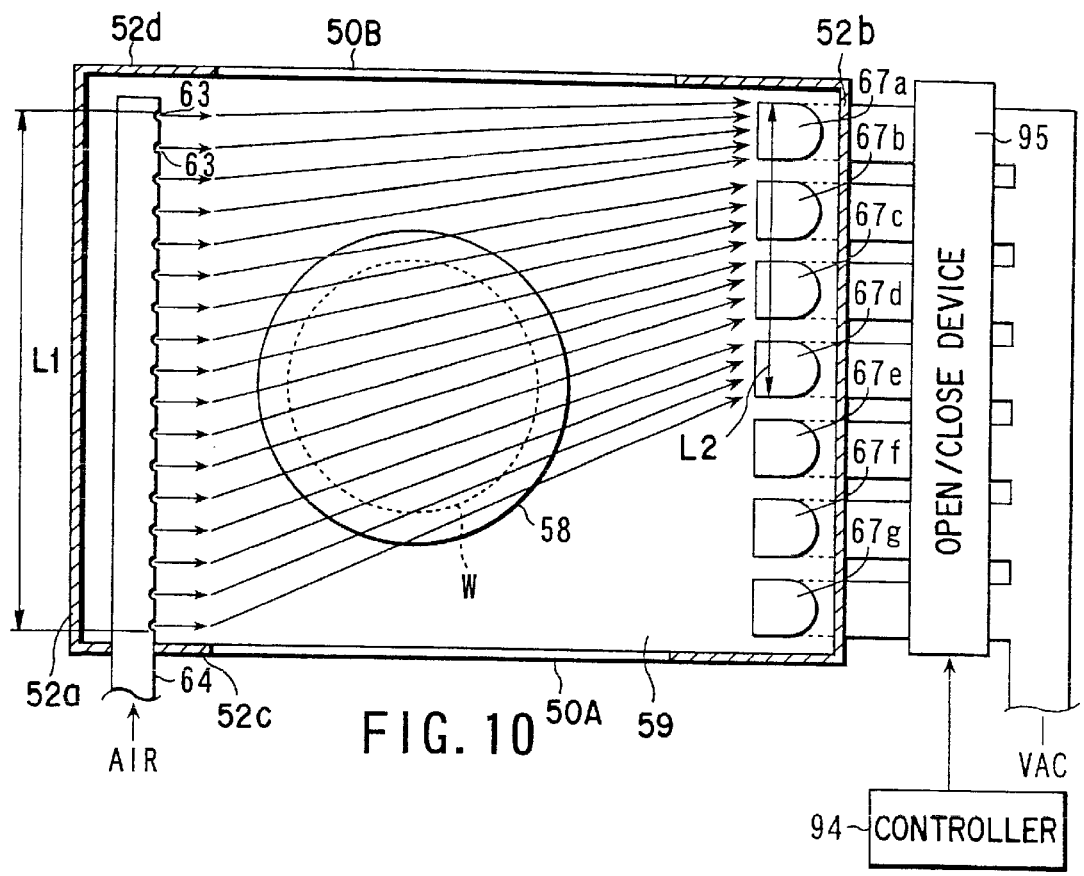
FIG. 10 is a schematic plan view showing air streams according to a first modified example of Embodiment 1.

Now, referring to FIG. 10, another embodiment of the present invention will be explained. Note that further explanation is omitted as to the same structural elements of this embodiment as those of the embodiment mentioned above.

In the heat treatment apparatus of this embodiment, seven exhaust ports 67a–67g are arranged at regular intervals along the second lateral wall 52b. These exhaust ports 67a–67g communicate with the exhaust system 92 (not shown). An open/shut unit 95 is interposed between the exhaust system 92 and the exhaust ports 67a–67g. The open/shut unit 95 is responsible for opening and shutting the communication between each of the exhaust ports 67a–67g and the exhaust system under control of the controller 94.

According to the heat treatment apparatus, the air stream can be exhausted from an exhaust port arbitrarily chosen from the exhaust ports 67a–67g. For example, if the exhaust ports 67a–67d are only opened by the open/shut unit 95 and air is exhausted from them, the resultant air steams is formed into a trapezoidal flowing region. In this case, an effective exhaustion opening length L2 of the exhaust ports 67a–67d is shorter than an effective opening blow-out opening. length L1 of the nozzle holes 63. The wording "effective exhaustion opening length L2" used herein refers to the lateral length of exhaust ports array (67a–67d) capable of inhaling the air at the same time. On the other hand, the wording "the effective blow-out opening length L1" used herein refers to the lateral length of a plurality of air blow-out ports (nozzle hole array 63) capable of blowing out the air at the same time.

According to this embodiment, a spiral stream is rarely generated near the exhaust ports. It is preferred to render the effective exhaustion opening length longer, since the occurrence of the spiral steam decreases.

In this embodiment, if exhaust ports to be involved in exhaustion of the air are sequentially switched from the first exhaust port 67a to the second exhaust port 67b and from the second exhaust port 67b to the third exhaust port 67c, the directions of gaseous streams can be changed little by little. As described, if the directions of the gaseous streams are sequentially changed, the gaseous streams become stable. As a result, the wafer W can be uniformly treated with heat.

Figure 11:
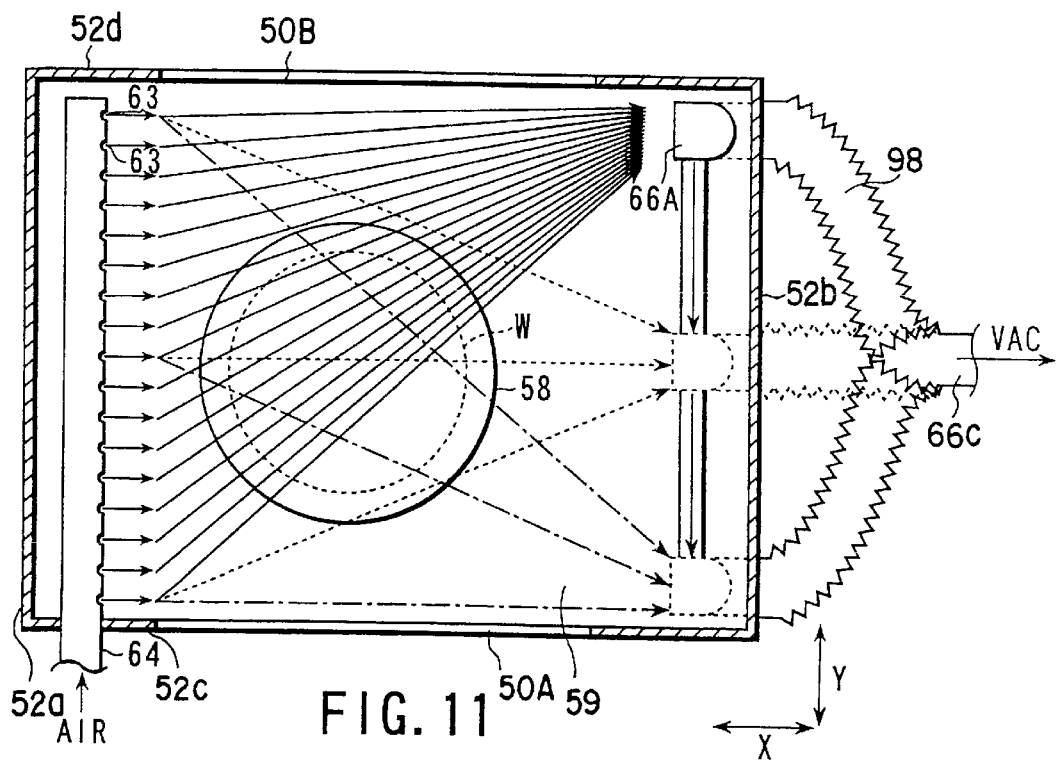
FIG. 11 is a schematic plan view showing air streams according to a second modified example of Embodiment 1.

Referring now to FIG. 11, another embodiment of the present invention will be described. Note that explanation will be omitted as to the same structural elements of this embodiment as those of the aforementioned embodiments.

In the heat treatment apparatus of this embodiment, the exhaust port of the exhaust pipe 66A is supported by a moving mechanism (not shown) movable in the Y-axis direction along the second wall 52b. The moving mechanism has a crank, a motor applying rotational driving force to the crank, and a reciprocating slider linked to the crank. The exhaust port of the exhaust pipe 66A is reciprocally moved along the second lateral wall 52b by the moving mechanism. The exhaust port of exhausting pipe 66A of the exhaust system (not shown) is connected to a pipe 66c by means of a flexible pipe 98. Thus, the pipe 98 can move in accordance with the movement of the exhaust port of the exhaust pipe 66.

As described, since the directions of the gaseous streams are changed slowly by switching the position of the exhaust port of the exhaust pipe 66A, the spiral stream rarely occurs. As a result, the wafer W is uniformly treated with heat.

Figure 12:
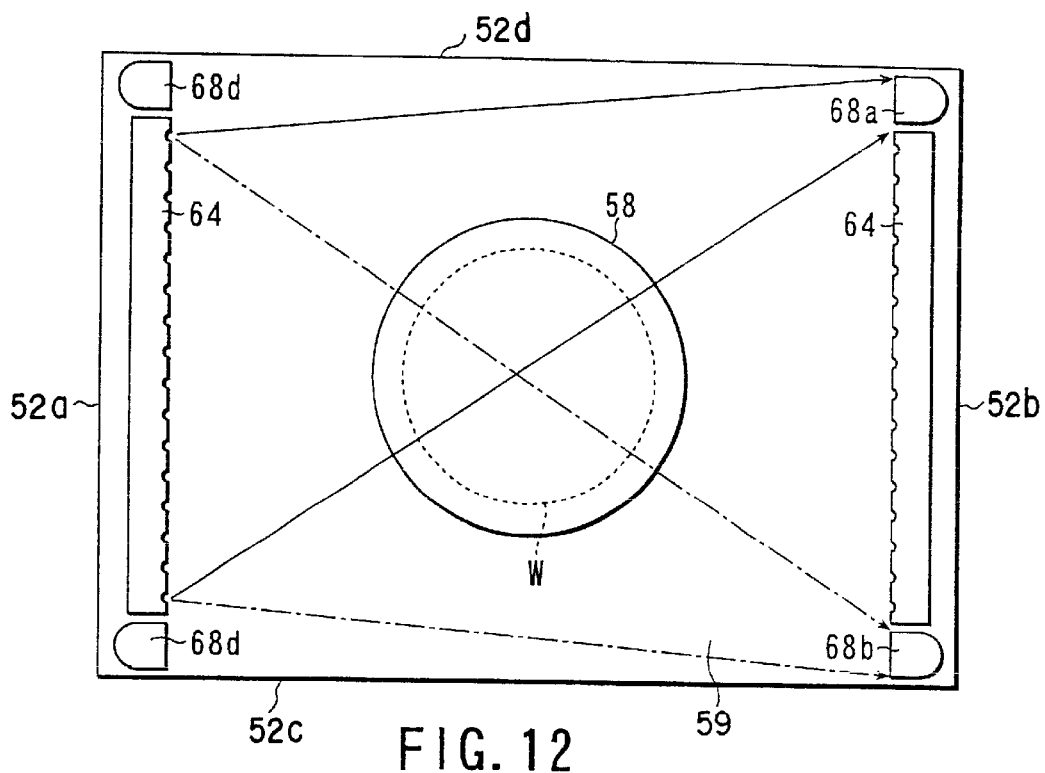
FIG. 12 is a schematic plan view showing air streams according to a third modified example of Embodiment 1.

Now, referring to FIG. 12, another embodiment of the present invention will be explained. Note that explanation will be omitted as to the same structural elements of this embodiment as those of the aforementioned embodiments.

In the heat treatment apparatus of this embodiment, a second linear pipe 64b is arranged along the second lateral wall 52b so as to face a first linear pipe 64a. Exhaust ports of the pipes 68a, 68b are arranged at both ends of the second linear pipe 64b, respectively. Exhaust ports of export pipes 68c, 68d are also arranged at both ends of the first linear pipe 64a, respectively. The first linear pipe 64a is operated in couple with the exhaust pipes 68a, 68b by the controller 94. Similarly, the second linear pipe 64b is operated in couple with the exhaust pipes 68c, 68d.

If the exhaust pipes 68a and 68b are operated alternately while the air is allowed to flow from the first linear pipe 64a, virtually parallel streams (heading to the right in FIG. 12) to the wafer can be formed. On the other hand, if the exhaust pipes 68c, 68d are operated alternately while the gas is allowed to flow from the second linear pipe 64b, virtually parallel streams flowing in a reverse direction (heading toward the left in FIG. 12) can be obtained. The switching operation is performed by operating a switching unit (not shown) on the basis of a control signal sent from the controller 94.

According to the heat treatment apparatus, the directions of the virtually parallel streams can be reversed from the right to the left and vise versa, thermal unbalance to be generated between the upstream and the downstream of the gaseous streams is successfully prevented. Therefore, the heat treatment is performed more uniformly.

Figure 13:
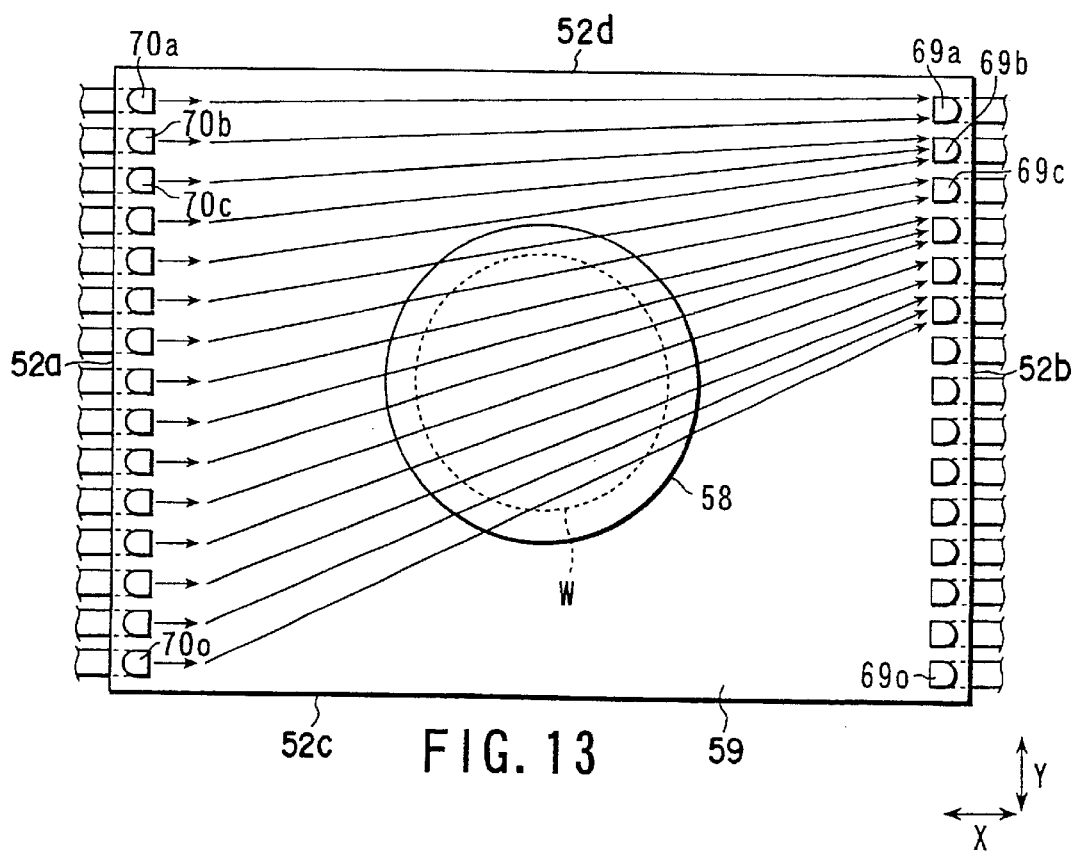
FIG. 13 is a schematic plan view showing air streams according to a fourth modified example of Embodiment 1.

Referring now to FIG. 13, another embodiment of the present invention will be explained. Note that explanation will be omitted as to the same structural elements of this embodiment as those of the aforementioned embodiments.

The heat treatment apparatus of this embodiment, a first group of nozzle holes 69a–69o are arranged in line along the first lateral wall 52a. A second group of nozzle holes 70a–70o are arranged in line along the second lateral wall 52b. The first and second nozzles holes 69a–69o, 70a–70b communicate with the gas supply system 91 (not shown) as well as the exhaust system 92 (not shown). A switching unit (not shown) is interposed between the gas supply system 91 and the exhaust system 92. The switching unit is responsible for operating the gas supply system 91 and the exhaust system 92 independently and switching them to each other on the basis of the control signal sent from the controller 94.

According to the heat treatment apparatus mentioned above, the direction of the virtually parallel streams can be reversed. It is possible to prevent thermal unbalance generating between the upstream and the downstream. Therefore, the heat treatment can be performed uniformly.

In the aforementioned heat treatment apparatus, it is not necessary to arrange the nozzle holes and the exhaust pipe independently. It is therefore possible to simplify the structure of the apparatus and to miniaturize the apparatus.

Now, referring to FIGS. 14 to 24, Embodiment 2 of the present invention will be explained. Note that explanation will be omitted as to the same structural elements of this embodiment as those of the aforementioned embodiments.

Figure 14:
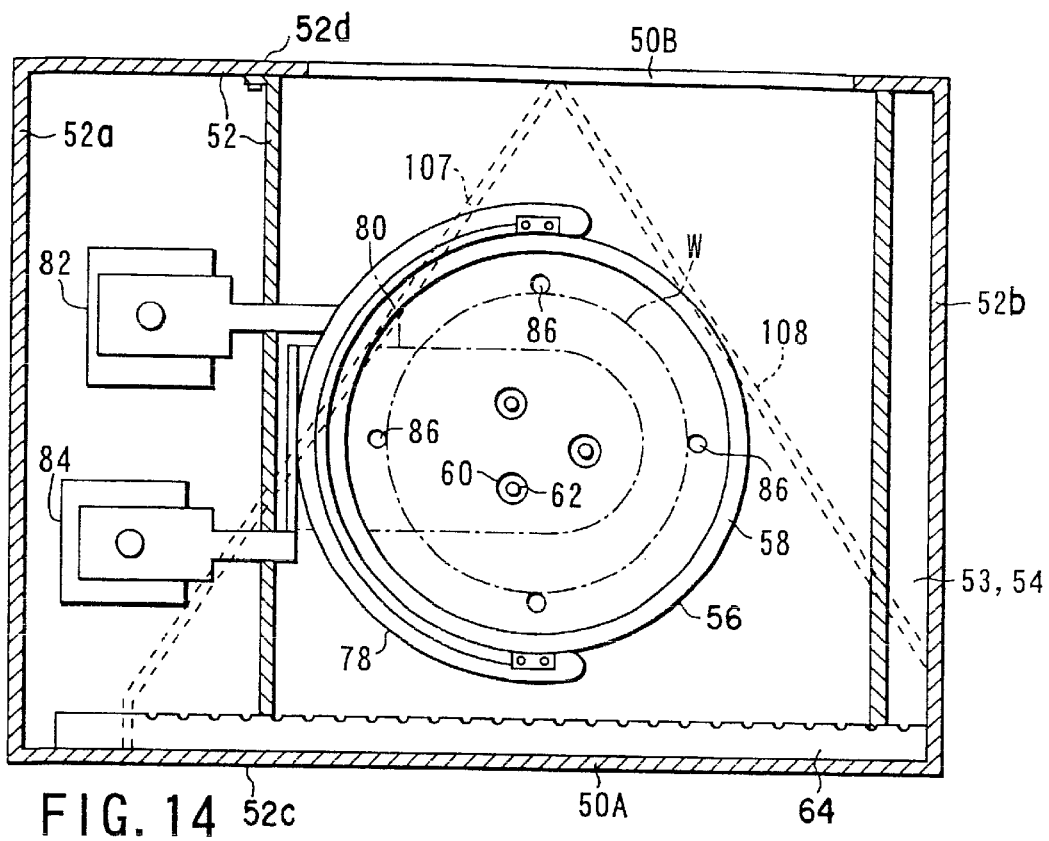
FIG. 14 is a perspective sectional view of a heat treatment apparatus according to Embodiment 2 of the present invention, as viewed from the upper side.
Figure 15:
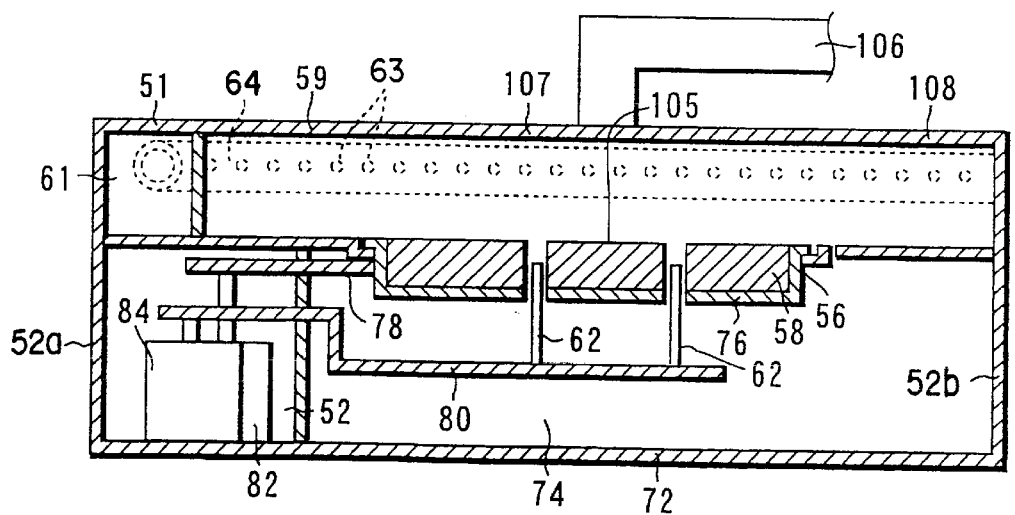
FIG. 15 is a perspective sectional view of the heat treatment apparatus according to Embodiment 2 of the present invention, as viewed from the lateral side.

As shown in FIGS. 14 and 15, a circular through-hole 56 is formed at near the center of a shielding board 55. The upper portion of the hot plate 58 is exposed to the treatment space 59 between the shielding board 55 and a ceiling board 57 through the circular hole 56. A linear pipe 64 and air boards 107, 108 are arranged so as to surround the hot plate 58 to form an equilateral triangle in the treatment space 59. Accordingly, the hot plate 58 is located at the center of the equilateral triangle. The linear pipe 64 extends in the X-axis direction along the third lateral wall 52c and arranged in the upper portion of the treatment space 59. When air is blown out from the nozzle holes 63, the air stream is passed through the upper region of the hot plate 58.

Figure 16:
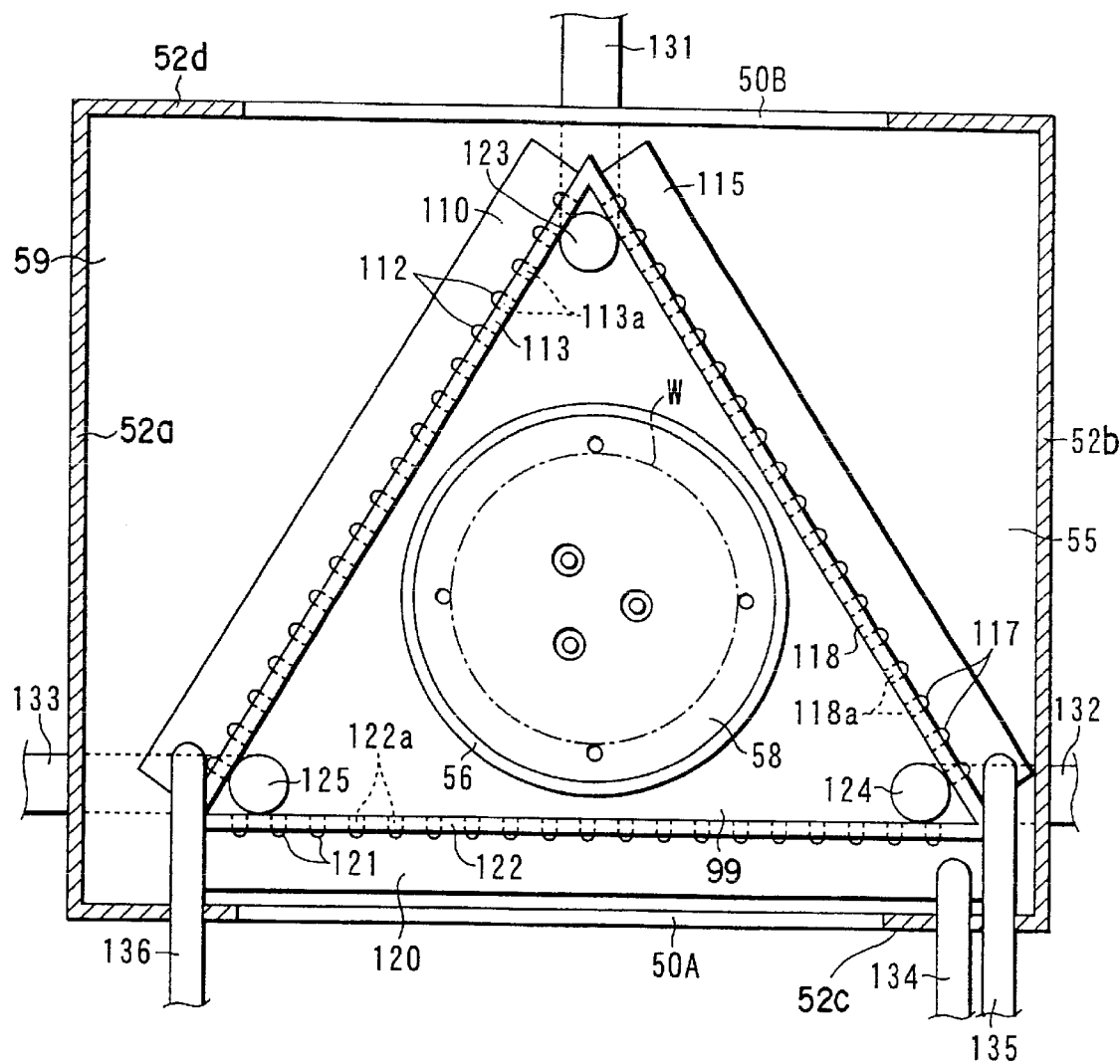
FIG. 16 is a perspective sectional view of the heat treatment apparatus according to Embodiment 2, whose upper portion is partially broken away.

As shown in FIG. 16, three linear pipes 110, 115, 120 are arranged in the form of an equilateral triangle so as to surround the hot plate 58. The hot plate 58 is located at the center of the equilateral triangle formed of pipes 110, 115 and 120. A number of nozzle holes 112 are formed in the lateral portion of the first linear pipe 110. The air is designed to be blown out virtually horizontally from each of the nozzle holes 112. A number of nozzle holes 119 are formed in the lateral portion of the second linear pipe 115. The air is blown out from each of the nozzle holes 119 virtually horizontally. Also, a number of nozzle holes 121 are formed in the lateral portion of the third linear pipe 120. The air is blown out almost horizontally from each of the nozzle holes 121.

Figure 17:
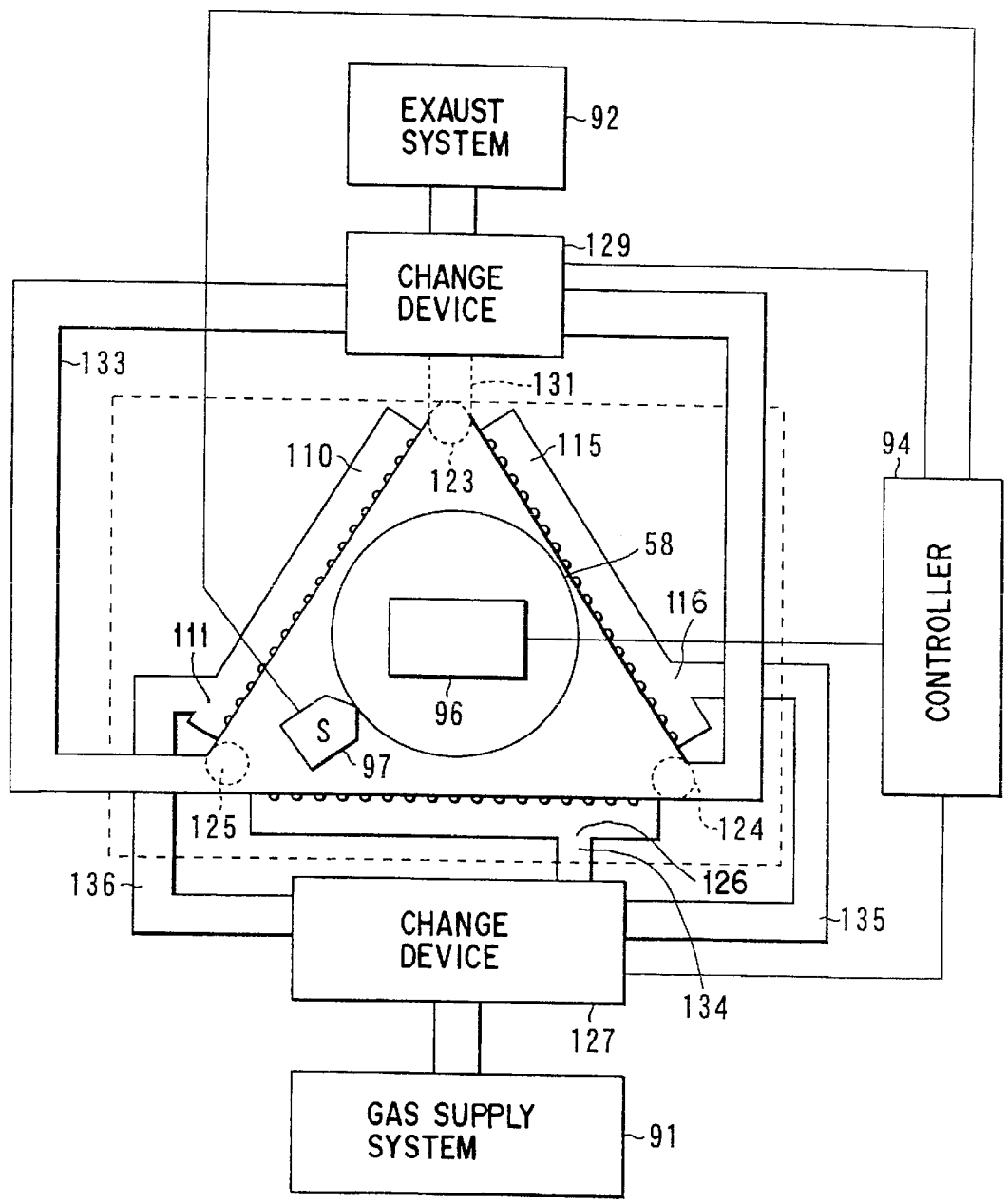
FIG. 17 is a block diagram showing a control system of the heat treatment apparatus according to Embodiment 2.

As shown in FIG. 17, the air is supplied from the gas supply system 91 and selectively distributed to three pipes 134, 135, 136 by the switching unit 127. The air is further sent to linear pipes 110, 115, 120 via inlet ports 111, 116, 126, respectively, and blown out from each of nozzle holes 112, 119, 121. Air boards 113, 118, 122 are respectively formed on the lateral surfaces of the linear pipes 110, 115, 120, respectively.

The first linear pipe 110 is closed at both ends and communicated with the gas inlet port 111 which is formed in the close proximity with one of the ends. The gas inlet port 111 communicates with the gas supply system 91 by way of the pipe 136 and the switching unit 127. The first, second, and third linear pipes 110, 115, 120 have substantially the same structures.

Figure 18:
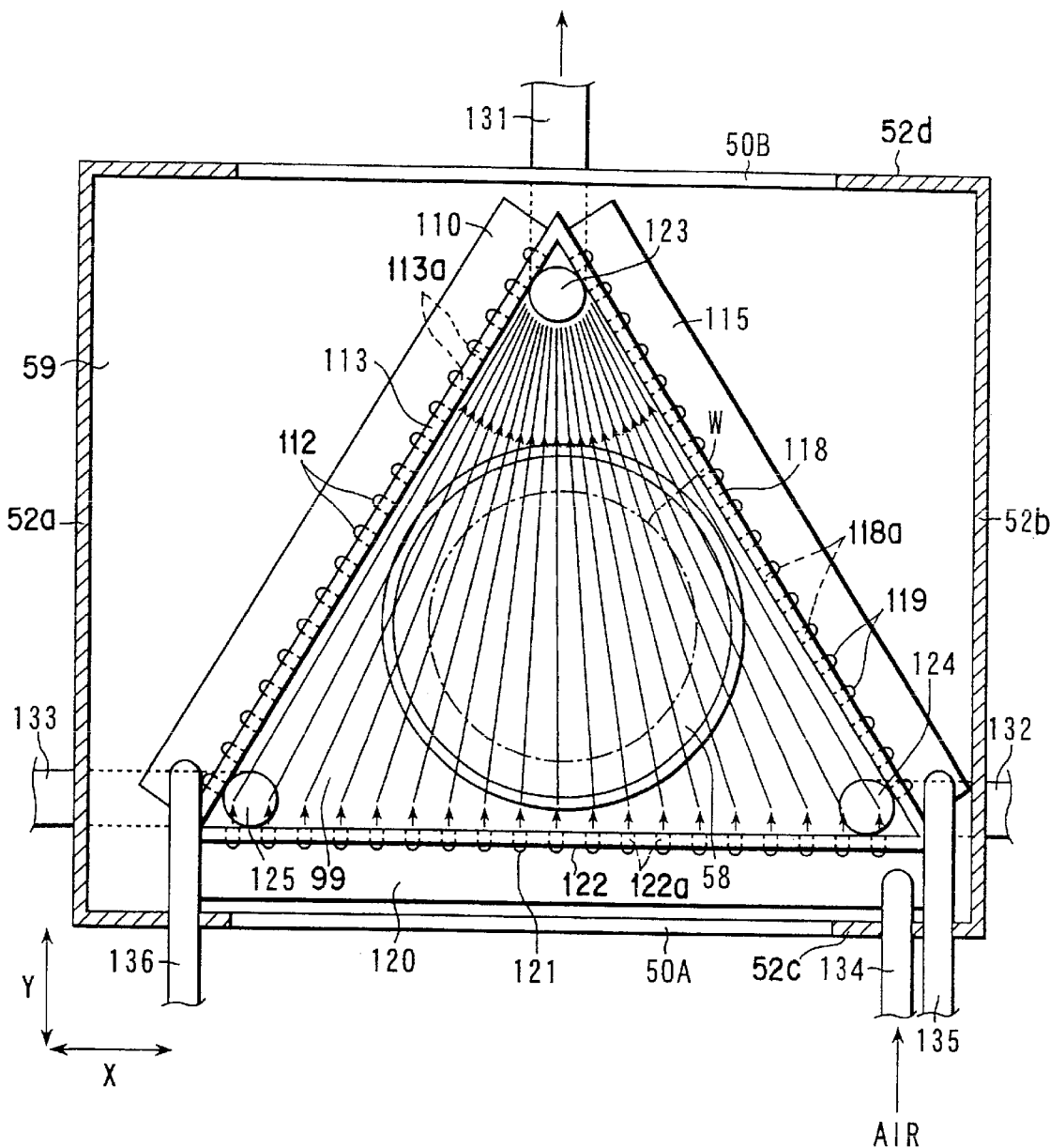
FIG. 18 is a schematic plan view showing air streams within the heat treatment apparatus according to Embodiment 2.

As shown in FIG. 18, the air board 113 is attached to the lateral surface of the first linear pipe 110 in order to regulate the shape of the air stream. More specifically, the air board 113 regulates the air stream into virtually an equilateral triangular gas flowing region 99 above the hot plate 58. The air board 113 is formed of a long and narrow rectangular board and has through holes 113a communicating with the nozzle holes 112. These through holes 113a are located in the lateral surface of the air board 113 corresponding to the nozzle holes 112 so as to communicate the holes 112. With this structure, the air blown out from the nozzle holes 112 flows through the through hole 113a toward the hot plate 58.

Exhaust ports 123, 124, 125 are formed respectively at three apexes of substantially triangular gas flowing region 99. These exhaust ports 123, 124, 125 communicate with the exhaust system 91 by way of the switching unit 127, thereby exhausting the air from the chamber 52.

In this embodiment, opening diameters and shapes of the nozzle holes 112, 119, 121 are set completely identical. However, if the opening diameters and shapes of the nozzle holes are appropriately changed, the gas flowing region can be formed easily and smoothly in substantially the triangular form. For example, the opening diameters of the linear pipes 110, 115, 120 may be the smallest near the center and gradually increased toward the right and left ends of the pipe. Conversely, the opening diameter of the linear pipes may be the largest near the center and gradually decreases toward the right and left ends.

Now, referring to FIG. 17, the control system of the apparatus according to this embodiment will be explained.

The control system has the heater 96, the sensor 97, three linear pipes 110, 115, 120, two switching units 127, 129, the gas supply system 91, the exhaust system 92, and the controller 94. The heater 96 is buried in the hot plate 58. The first switching unit 127 has a switching circuit which communicates with the gas supply system 91 and each of three pipes 134, 135, 136. The switching circuit is responsible for selecting one of three pipes 134, 135, 136 to allow it to communicate with the gas supply system 91. The pipes 134, 135, 136 are arranged between the switching unit 129 and the exhaust port 123, between the switching unit 127 and the exhaust port 124, and between the switching unit 127 and exhaust port 125, respectively. The switching unit 127 involved in exhaustion, which is responsible for switching the connection between the exhaust system 92 and the exhaust ports 123, 124, 125, is further connected to the controller 94. Therefore, the exhaust process is integrally controlled by the controller 94.

Although not shown in FIG. 17, the pins 62 protruding or withdrawing from the upper surface of the hot plate 58 and a driving system for driving a door (not shown) for opening/shutting the housing opening portion (loading and unloading port) 50A, 50B are also connected to the controller 94. Furthermore, a power supply circuit of the main wafer W transportation mechanism 22 is connected to the controller 94.

On the other hand, upon initiation of the power supply, the power source of the heater 96 within the hot plate 58 is turned on, thereby initiating heating of the hot plate 58. The hot plate 59 is controlled so as to become stable at a predetermined temperature while detecting temperature of the hot plate 58 by the sensor 97.

When the temperature of the hot plate 58 becomes stable at the predetermined temperature, the wafer W is transported by the main wafer transportation mechanism 22 onto the hot plate 58 thus heated.

As a next step, the operations of the gas supply system 91 and the exhaust system 92 are initiated, with the result that gaseous streams are formed above the hot plate 58.

Figure 19:
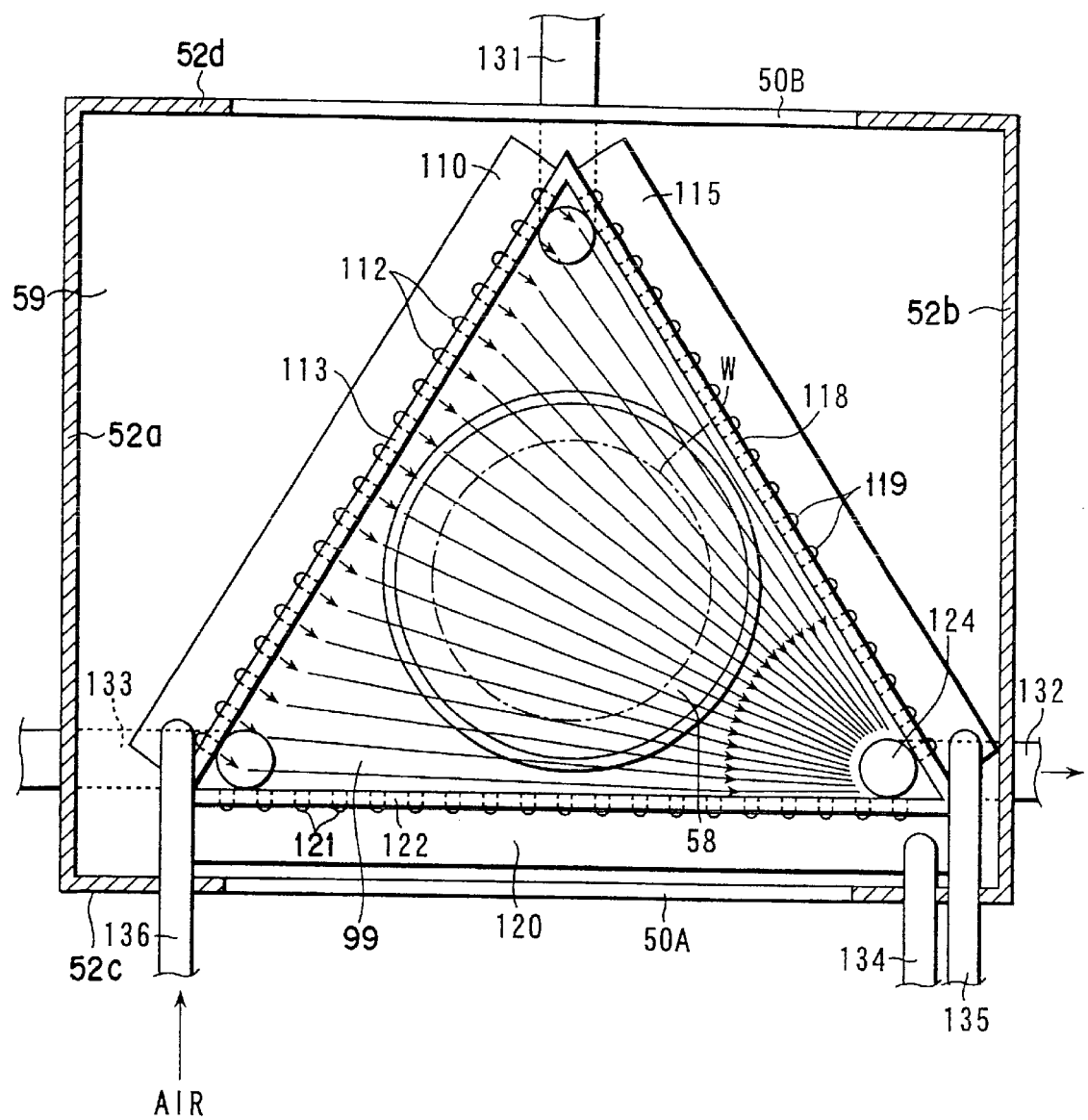
FIG. 19 is another schematic plan view showing air streams within the heat treatment apparatus according to Embodiment 2.
Figure 20:
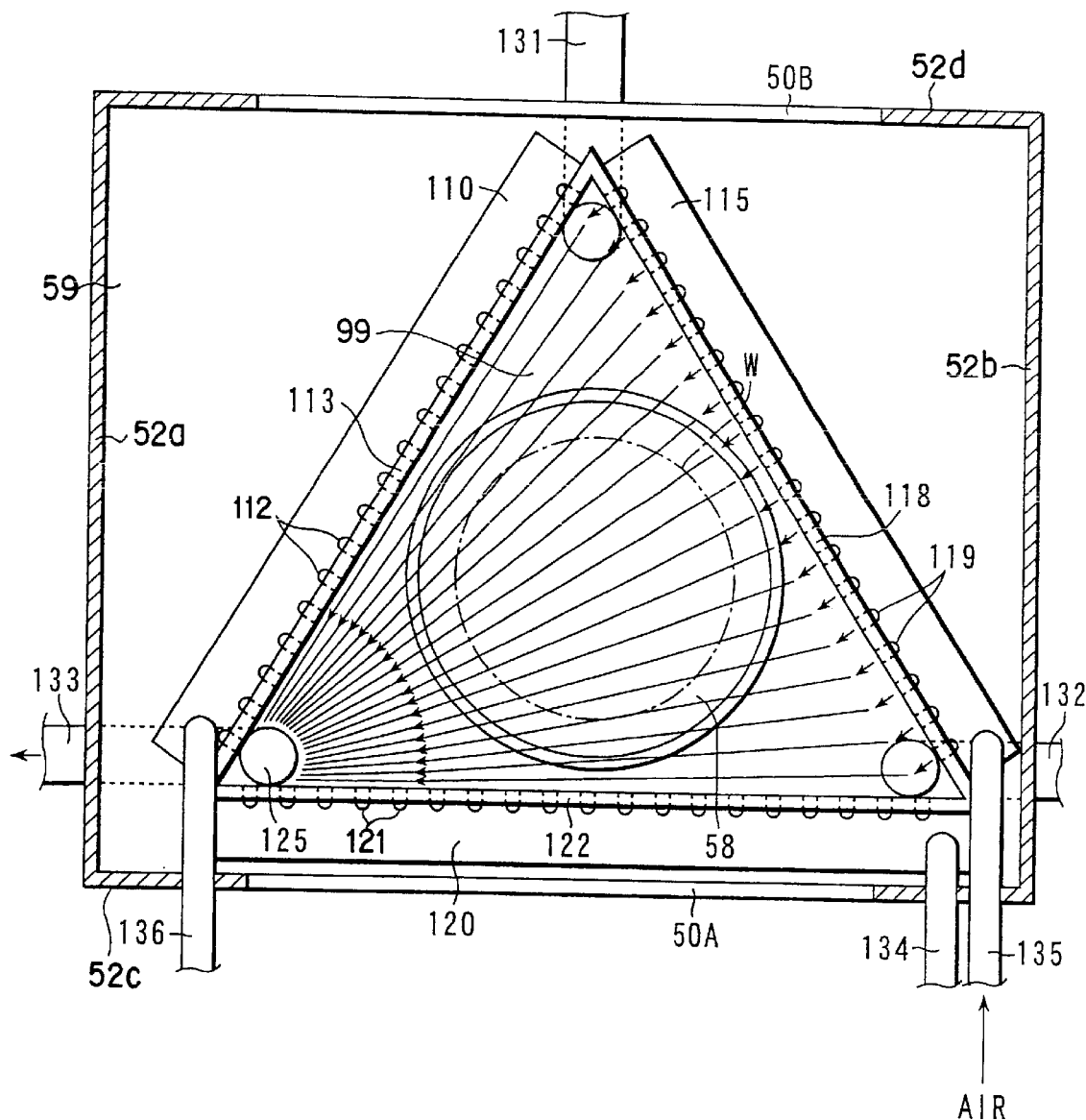
FIG. 20 is still another schematic plan view showing air streams within the heat treatment apparatus according to Embodiment 2.

Next, referring to FIGS. 18 to 20, we will explain gaseous streams formed in the region above the hot plate 58.

As shown in FIG. 18, the air is simultaneously blown out from the nozzle holes 121 of the third linear pipe 122, converged at a third corner, and exhausted through the third exhaust port 123. As shown in FIG. 19, the air is simultaneously blown out from the nozzle holes 112 of the first linear pipe 113, converged at a first corner, and exhausted through the first exhaust port 124. As shown in FIG. 20, the air is simultaneously blown out from the nozzle holes 119 of the second linear pipe 118, converged at a second corner, and exhausted through the second exhaust port 125.

In the initial stage of the heat treatment, the gas supply system 91 is communicated with the pipe 134 by operating the switching unit 127 on the basis of the instruction from the controller 94. In this way, the air is sent into the linear pipe 120; at the same time, the exhaust system 92 is communicated with the pipe 131 by the switching unit 129.

As shown in FIG. 18, the air is supplied from the gas supply system 91 to the linear pipe 120 by the switching unit 127, and blown out from the nozzle holes 121 into the chamber 52. Furthermore, the air is blown out from the nozzle holes 121 toward the exhaust port 123, converged at the exhaust port 123, and exhausted. At this time, since the exhaust port 131 is communicated with the exhaust system 92 by the second switching unit 129, a negative pressure given by the exhaust system 92 acts on the exhaust port 131. Therefore, the gas blown out from each of the nozzle holes 121 flows toward the exhaust port 123.

The air blown out from the nozzle holes 121 of the center portion of the pipe flows straight or near straight. On the other hand, the air blown out from the nozzle holes 121 in the close proximity with both ends of the pipe flows out straight (at virtually a right angle to the pipe 120) from the nozzle holes 121 but immediately hit upon the air boards 113, 118. The air proceeding direction is corrected by the air boards 113, 118 and guided along the air boards 113, 118, into the exhaust port 123. As a result, the gaseous streams draw radial lines converged into the exhaust port 123 and substantially in parallel with the surface of the air boards 113, 118, as shown in FIG. 18.

As described, the exhaust port 123 and the linear pipe 120 are arranged so as to sandwich the hot plate 58 above the hot plate 58 in the heating treatment apparatus. In addition, the air boards 113, 118 are provided so as to guide the air stream from both ends of the nozzle hole array 121 formed in the lateral side of the linear pipe 120, into the exhaust port 123. As a result, the gas blown out from the nozzle hole 121 is led along the air boards 113, 118 to form a virtually triangular gas flowing region 99 above the hot plate 58. In the gas flowing region 99, the adjacent gaseous streams moves straight while keeping regular intervals between them. As a result, neither spiral nor stagnant gaseous streams occur, contributing to uniform heating.

The gas supply system 91 is communicated with the pipe 136 by the first switching unit 127; at the same time, the exhaust system 92 is communicated with the pipe 132 by the second switching unit 129. When flow passage is changed by the first and second switching units 127, 129, the air blows out from the nozzle holes 112 almost in perpendicular to the linear pipe 110, then regulated by the air boards 118, 122, forms into the gas flowing region 99 of virtually a triangular form, as shown in FIG. 19.

Furthermore, the gas supply system 91 is allowed to communicate with the pipe 135 by the first switching unit 127; at the same time, the exhaust system 92 is allowed to communicate with the exhaust pipe 133 by the second switching unit 129. When the flow passage is changed by the first and second switching units 127, 129, the air is blown out from the nozzle holes 119 in almost perpendicular to the linear pipe 115. The gaseous streams are then regulated by the air boards 113, 122 to form the gas flowing region 99 in the form of virtually a triangle as shown in FIG. 20.

According to the apparatus of this embodiment, even if particles are contained in the gaseous streams flowing through the upper space 59, neither speed loss nor stagnation of gaseous streams occurs. It follows that the particle will not fall upon the wafer W and thus not adhere on the wafer W in the heat treatment chamber.

In the apparatus of this embodiment, the directions of the gaseous streams are sequentially switched in three different directions by switching the communications of the exhaust system 92 with the exhaust ports 123, 124, 125. In this manner, unbalance in heat supply amount between the upper and lower portion of the gaseous streams can be canceled out. The heat treatment is applied uniformly over the entire surface of the wafer W.

Furthermore, three linear pipes 110, 115, 120 are arranged in the triangular form so as to surround the hot plate 58. These three linear pipes 110, 115, 120 act as a flow-regulating plate for regulating the gaseous streams.

In the apparatus of this embodiment, the gaseous streams flow in parallel with the upper surface (wafer W) of the hot plate 58, so that the upper space 59 can be narrower above the hot plate 58. It follows that the height of the entire heat treatment apparatus can be reduced. As a result, the entire heat treatment apparatus can be miniaturized.

In the aforementioned embodiments, a heating-type heat treatment apparatuses for heating the wafer W are explained as examples. However, the present invention can be applied to a cooling-type heat treatment apparatus.

Referring now to FIGS. 21 to 24, the heat treatment apparatus according to another embodiment of the present invention will be explained. Note that explanation will be omitted as to the same structural elements of this embodiment as those of the aforementioned embodiments.

Figure 21:
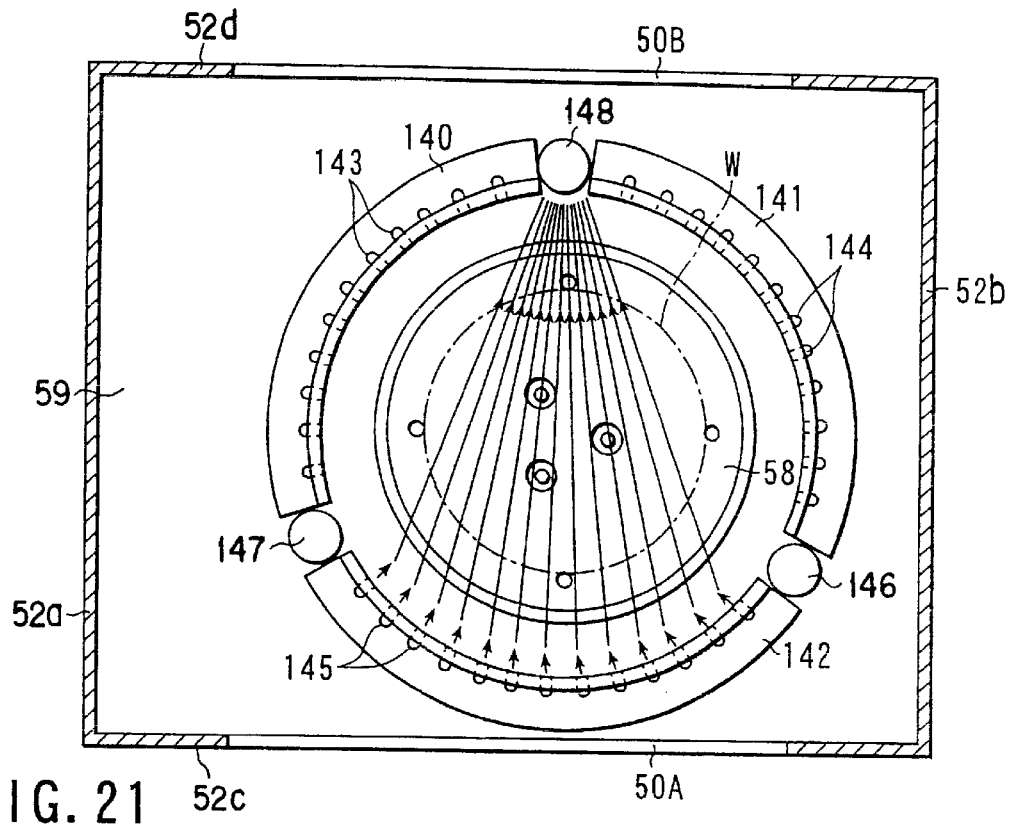
FIG. 21 is a perspective sectional view of the heat treatment apparatus according to a first modified example of Embodiment 2, as views from the upper side.

As shown in FIG. 21, three arc-form pipes 140, 141, 142 surround the hot plate 58 to form a single ring, in the heat treatment apparatus of this embodiment. The ring is concentric with a circle of the hot plate 58. Each of the pipes 140, 141, 142 communicates with the gas supply system 91 (not shown) via the switching unit 127 (not shown).

The third exhaust port 148 is formed between the first arc-form pipe 140 and the second arc-form pipe 141. The first exhaust port 146 is formed between the second arc-form pipe 141 and the third arc-form pipe 142. The second exhaust port 147 is formed between the first arc-form pipe 140 and the third arc-form pipe 142. In short, the first arm-form pipe 140 faces the first exhaust port 146 with the hot plate 58 interposed between them. The second arc-form pipe 141 faces the second exhaust port 147 and the third arc-form pipe 141 faces the third exhaust port 147. The exhaust ports 146, 147, 148 communicate with the exhaust system 92 (not shown) by the switching unit 129 (not shown).

In the lateral inner surfaces of the arc-form pipes 140, 141, 142, numeral nozzle holes 143, 144, 145 are respectively perforated vertically. These nozzle holes 143, 144, 145 face the center of the hot plate 58. Therefore, the air blown out from the nozzle holes 143, 144, 145 are easily converged at the exhaust ports 146, 147, 148 respectively. The air flow is easily rendered stable.

The three arc-form pipes 140, 141, 142 are combined to form a ring. The space occupied by the gas supply mechanism is therefore reduced. The apparatus can be miniaturized.

Figure 22:
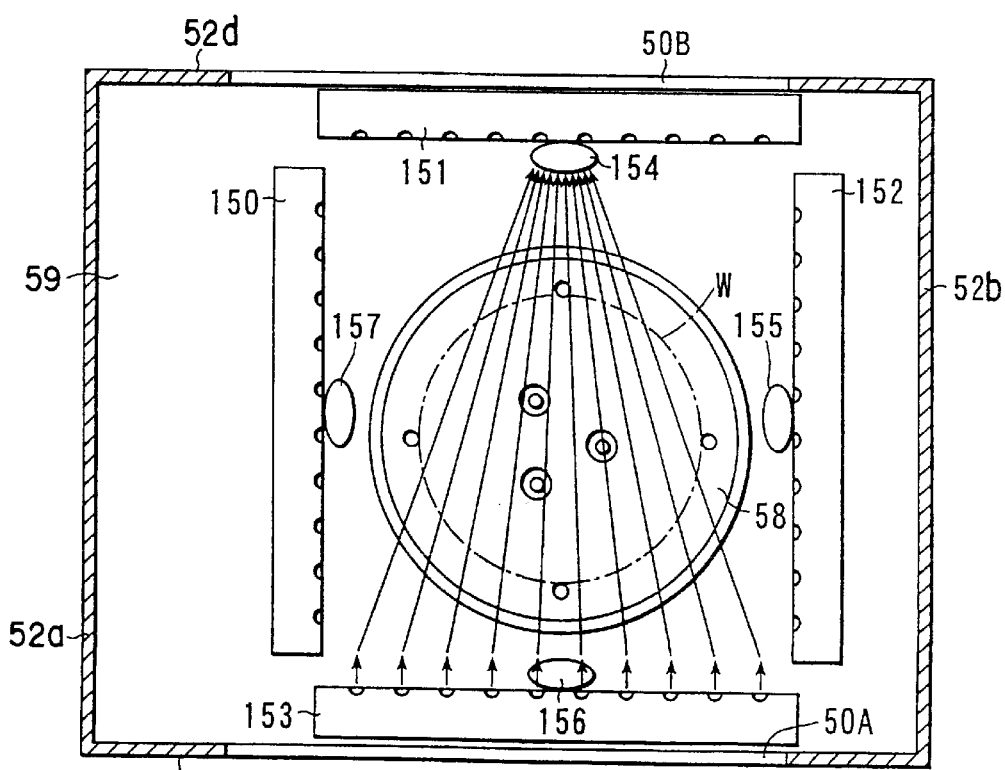
FIG. 22 is a perspective sectional view of the heat treatment apparatus according to a second modified example of Embodiment 2, as views from the upper side.

As shown in FIG. 22, four linear pipes 150, 151, 152, 153 are arranged in a square form so as to surround the hot plate 58 in a plan view. Furthermore, four exhaust ports 154, 155, 156, 157 are arranged around the hot plate 58. The first pipe 150 faces the first exhaust port 155 with the hot plate interposed between them. The second pipe 151 faces the second exhaust port 156 with the hot plate interposed between them. The third pipe 152 faces the third exhaust port 157 with the hot plate 58 interposed between them. The fourth pipe 153 faces the fourth exhaust port 154 with the hot plate 58 interposed between them.

The pipes 150, 151, 152, 153 are communicated with the gas supply system 91 (not shown) via the switching unit 127

(not shown). The exhaust ports 154, 155, 156, 157 communicate with the exhaust system 92 (not shown) via the switching unit 129 (not shown). By switching the flow route by the first and second switching units 127, 129, four air steams, that is, the air stream flowing from the pipe 150 to the exhaust port 155, the air stream flowing from the pipe 151 to the exhaust port 156, the air stream flowing from the pipe 152 to the exhaust port 157, and the air stream flowing from the pipe 153 to the exhaust port 154, can be sequentially switched.

According to this embodiment, the air stream can be switched in the four directions having an angle of 90°, 180°, 270°, and 360° to the hot plate 58. Therefore, the heat treatment is applied uniformly to the wafer W.

Figure 23:
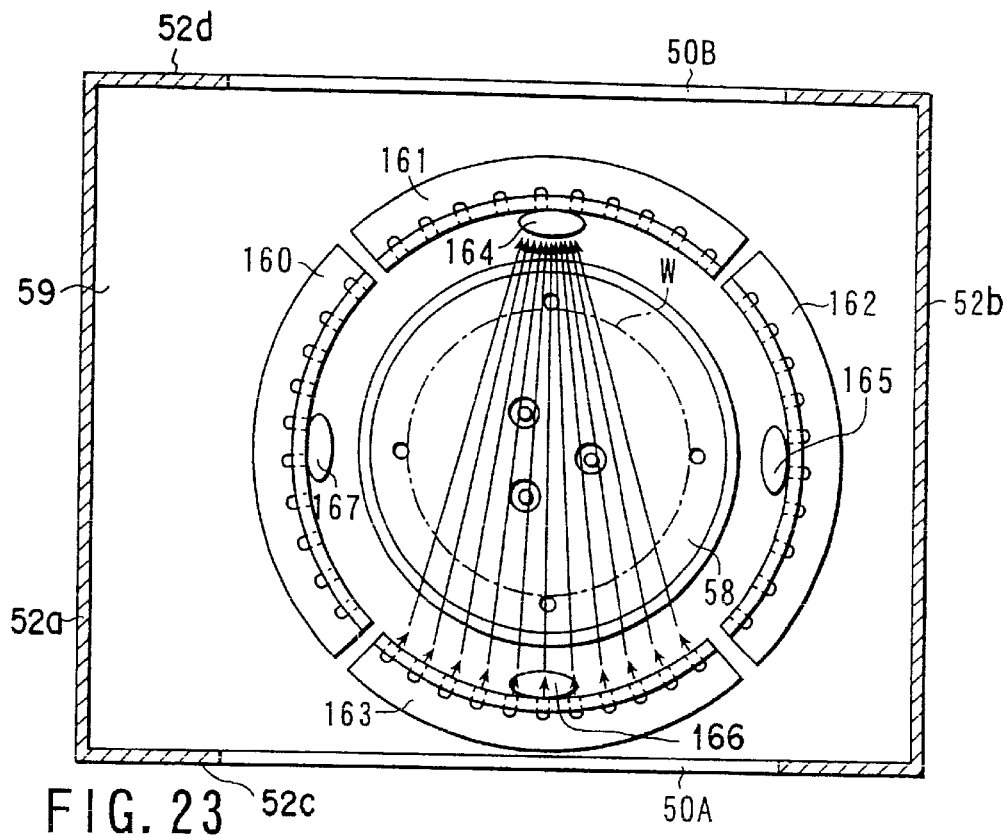
FIG. 23 is a perspective sectional view of the heat treatment apparatus according to a third modified example of Embodiment 2, as views from the upper side.

As shown in FIG. 23, four arc-form pipes 160, 161, 162, 163 are arranged in a ring form so as to surround the hot plate 58 in a plan view. Furthermore, four exhaust ports 164, 165, 166, 167 are arranged around the hot plate 58. The first pipe 160 faces the first exhaust port 165 with the hot plate 58 interposed between them. The second pipe 161 faces the second exhaust port 166 with the hot plate 58 interposed between them. The third pipe 162 faces the third exhaust port 167 with the hot plate 58 interposed between them. The fourth pipe 163 faces the fourth exhaust port 164 with the hot plate 58 interposed between them.

The pipes 160, 161, 162, 163 are communicated with the gas supply system 91 (not shown) by way of the switching unit 127 (not shown). The exhaust ports 164, 165, 166, 167 communicate with the exhaust system 92 (not shown) via the switching unit 129 (not shown). By switching the flow route from the first and second switching units 127, 129 and vise versa, the air stream flowing from the pipe 160 to the exhaust port 165, the air stream flowing from the pipe 161 to the exhaust port 166, the air stream flowing from the pipe 162 to the exhaust port 167, and the air stream flowing from the pipe 163 to the exhaust port 164 can be sequentially switched.

According to this embodiment, the four arc-form pipes 160, 161, 162, 163 are arranged in the ring form, so that the space occupied by the pipes is reduced, contributing to miniaturization of the apparatus.

Figure 24:
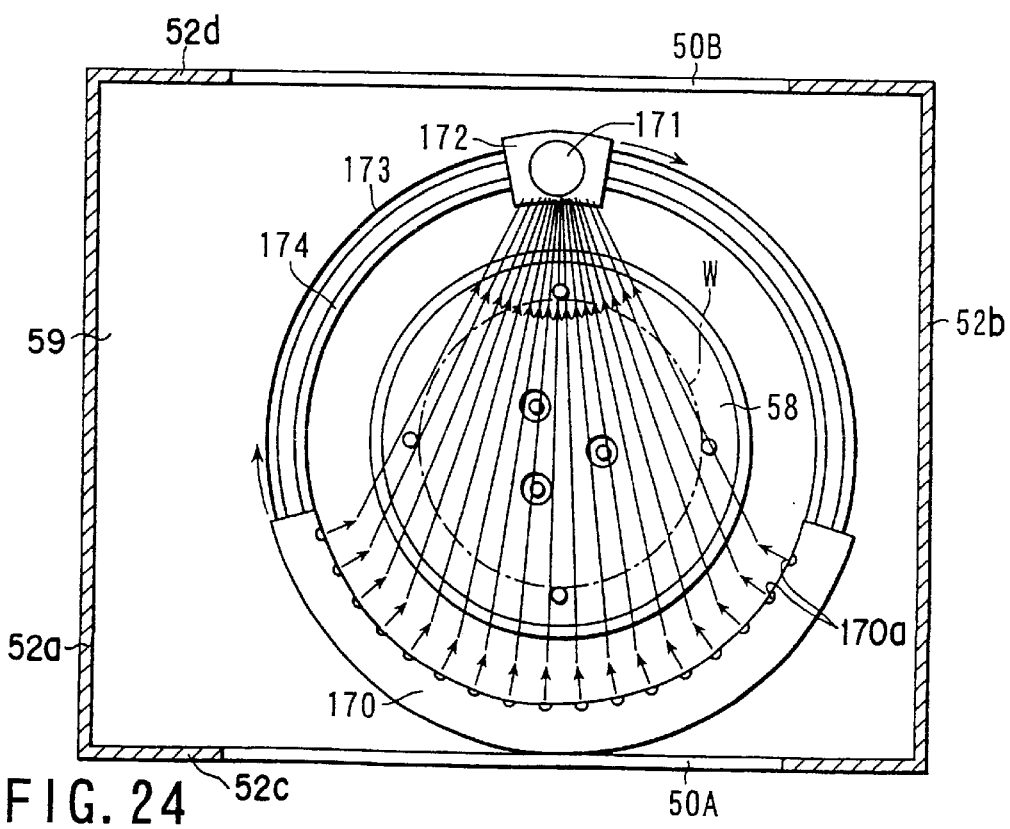
FIG. 24 is a perspective sectional view of the heat treatment apparatus according to a fourth modified example of Embodiment 2, as views from the upper side.

As shown in FIG. 24, a rail 173 is arranged around the hot plate concentrically therewith. On the rail 173, two sliders 170, 172 slidably move clockwise. The slider 170 is formed of an arc-form pipe having a plurality of gas blow-out holes 170a. The slider 172 is formed of a block having an exhaust port 171. The sliders 170 and 172 are moved synchronously by the controller 94 so as to face each other at all times. Incidentally, as a member for the gas supply mechanism, a square pipe may be used in place of a round pipe. In this case, the square pipe is preferably used since the lateral surface of the square pipe can be used as the air board.

Now, referring to FIGS. 25 to 28, another heat treatment apparatus according to another embodiment of the present invention will be explained. Note that explanation will be omitted as to the same structural elements of this embodiment as those of the aforementioned embodiments.

Figure 25:
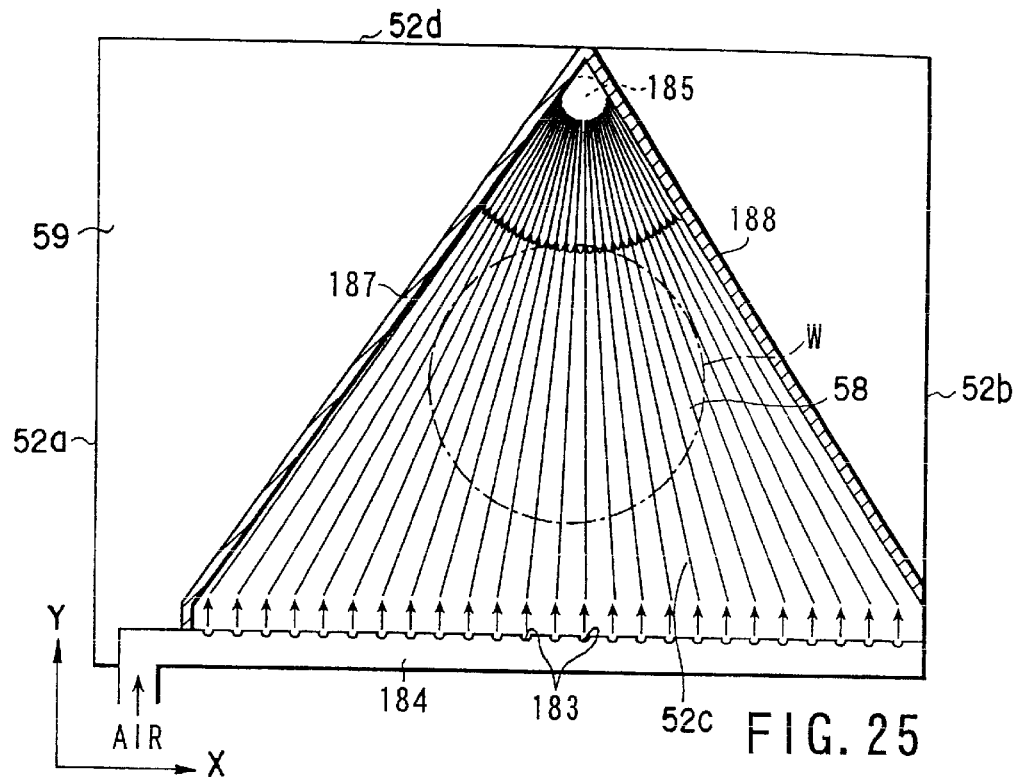
FIG. 25 is a schematic plan view showing air streams within a heat treatment apparatus according to Embodiment 3 of the present invention.

As shown in FIG. 25, a linear pipe 184 is arranged along the lateral wall 52c in the upper space 59. The linear pipe 184 extends in the X-axis direction and a plurality of nozzle holes 183 for blowing out the gas are arranged along the longitudinal direction of the pipe. A gas such as air or an inert gas is supplied from the gas supply system (not shown) to the linear pipe 184. In the close proximity with the lateral wall 52d, an exhaust port 185, which communicates with the exhaust mechanism (not shown), is arranged so as to face the linear pipe 184 with the hot plate interposed between them.

Two air boards 187, 188 are arranged extending from the linear pipe 184 to the exhaust port 185. The upper space 59 is partitioned by the air boards 187, 188. More specifically, the air board 187 extends from near one end portion of the linear pipe 184 to close proximity with the exhaust port 185. The air board 188 extends from near the other end portion of the linear pipe 184 to the close proximity with the exhaust port 185. These air boards 187, 188 are responsible for guiding the gas blown out from the nozzle holes 183 of the linear pipe 184 to the exhaust port 185 to thereby regulate the shape of the gas flowing region 99 in a virtually triangular form. Each of these air boards 187, 188 is formed of a long and narrow board and fitted to the ceiling 56a of the chamber.

According to this embodiment, since the air flows smoothly in the gas flowing region 99, neither spiral nor stagnant streams occur. As a result, the wafer W is heated uniformly by the hot plate 58.

Incidentally, the opening diameter and the gas blow-out angle of the nozzle holes 183 may be freely varied. In the case, the aperture and the gas blow-out angle are controlled on the basis of the detection temperature of the hot plate 58. More specifically, when the temperature of the hot plate in a close proximity with the linear pipe 64 is significantly reduced, the opening diameters of the nozzle holes 183 near the center of the linear pipe 184 are reduced, whereas the opening diameters of the nozzle holes 183 near both ends of the linear pipe 184 are increased.

Furthermore, in the case where temperature of the hot plate 58 near the linear pipe 184 is significantly reduced, an angle of the nozzle holes 183 located near the center thereof is changed so as to direct toward the air board 187 or 188 in place of straightforward direction in order for the air steams not in direct contact with the portion of the hot plate 58 near the linear pipe 64.

Figure 26:
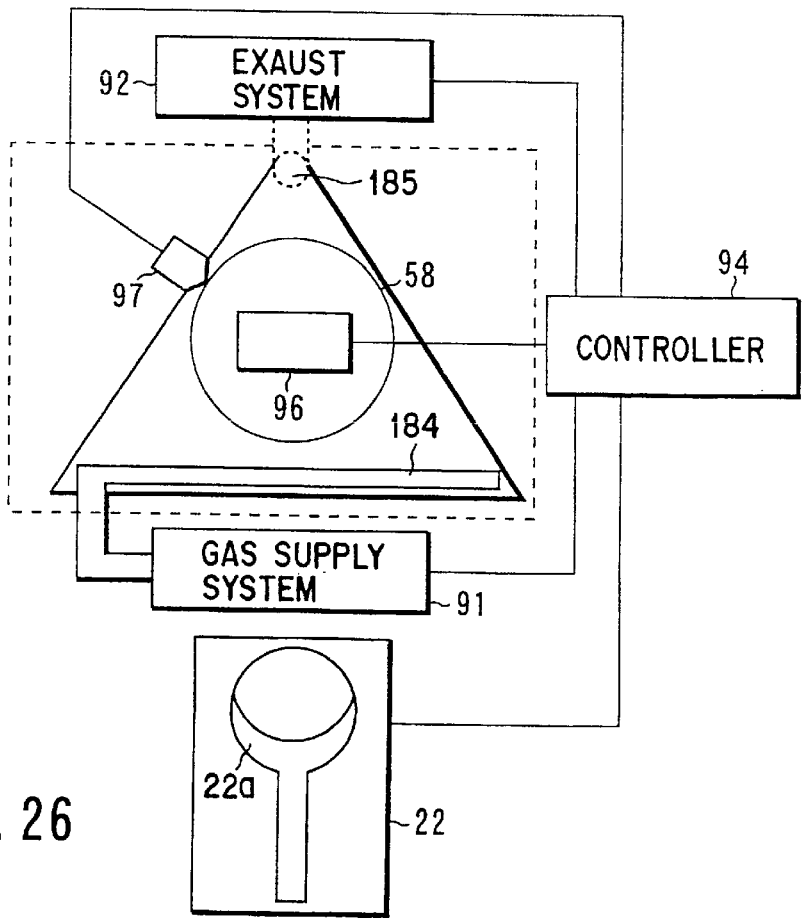
FIG. 26 is a block diagram showing a control system of the heat treatment apparatus according to Embodiment 3.

Now, referring to FIG. 26, the control system of the heat treatment apparatus will be explained.

A temperature sensor 97 and the main arm mechanism 22 are connected to an input side of the controller 94. On the other hand, the gas supply system 91, the exhaust system 92, the heater 96, and the main arm mechanism 22 are connected to an output side of the controller 94. The controller 94 controls operations of the gas supply system 91 and the exhaust system 92 on the basis of the detection temperature of the hot plate 58 and the timing for loading/unloading the wafer W into/from the heat treatment apparatus. As a result, desired gaseous streams are formed in the upper space 59.

Figure 27:
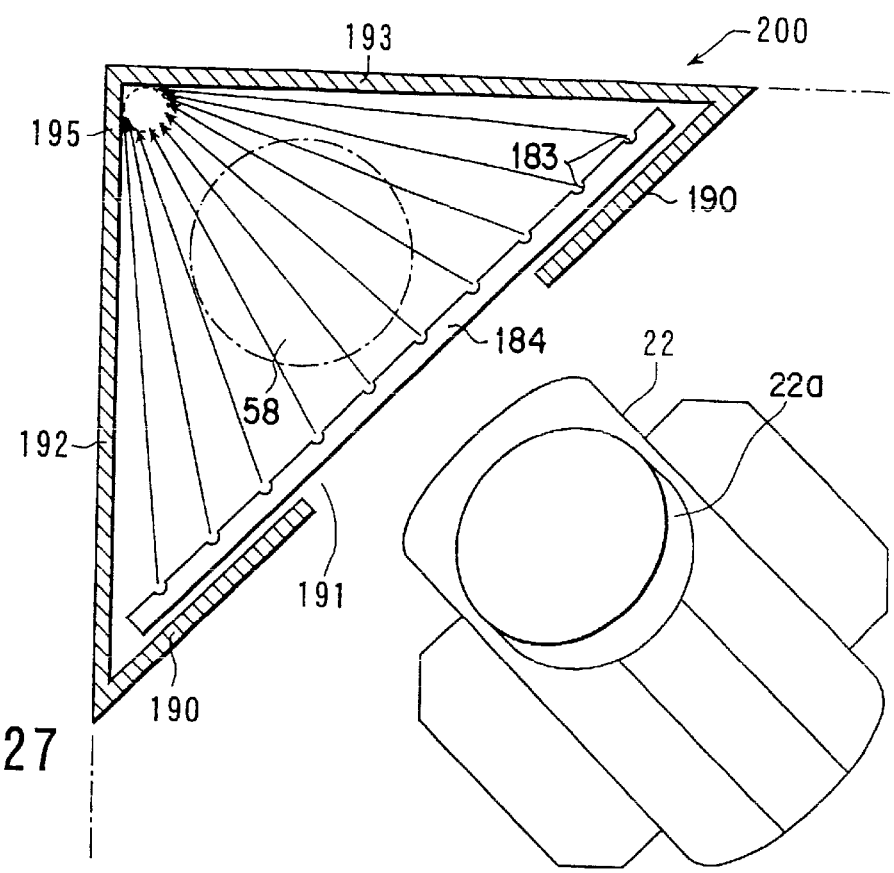
FIG. 27 is a perspective sectional view of the heat treatment apparatus according to a modified example of Embodiment 3, as viewed from the upper side.

As shown in FIG. 27, a triangular prism corner assembly 200 having an isosceles right triangular bottom may be employed in a corner portion of the chamber of the heat treatment apparatus. The corner assembly 200 has a hot plate 58, a front surface board 190, an opening 191, lateral surface boards 192, 193, and an exhaust port 195. The opening 191 is defined by a pair of the front surface boards 190. The holder 22a of the main arm mechanism 22 goes in and out through the opening 191. In the opening 191, the linear pipe 184 is arranged. The air is blown out from the gas blow-out ports, i.e., the nozzle holes 183 toward the exhaust port 195. The exhaust port 195 is formed in the most inner part of the upper surface of the corner assembly 200, as viewed from the opening side. The exhaust port 195 faces the linear pipe 184 with the hot plate 58 interposed between them.

Figure 28:
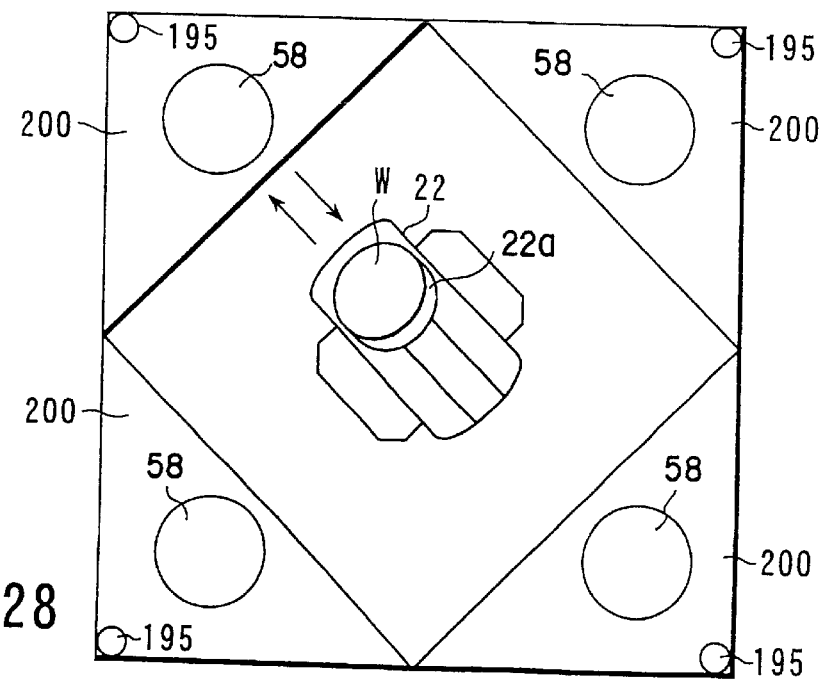
FIG. 28 is a schematic plan view of the baking system having a plurality of treatment units according to Embodiment 3.

As shown in FIG. 28, four corner assemblies 200 may be provided in a region to which the main arm mechanism 22 can gain access. If so, a dead space within the heat treatment system can be used effectively, contributing to the further miniaturization of the substrate processing system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An heat treatment apparatus comprising:
   a chamber;
   a hot plate for supporting and heating a substrate in the chamber;
   a first pipe having a single or a plurality of gas blow-out ports for supplying a gas along the substrate so as to cover the substrate placed on the hot plate in an upper space above the hot plate in the chamber;
   first and second exhaust ports facing both ends of the first pipe with the hot plate interposed therebetween;
   a second pipe interposed between the first and second exhaust ports;
   a third and fourth exhaust ports facing both ends of the second pipe with the hot plate interposed therebetween, the first pipe being arranged between the third and fourth exhaust ports;
   a gas supply system communicating with the first and second pipes for supplying a gas to each of the first and second pipes;
   an exhaust system communicating with the first, second, third, and fourth exhaust ports, for exhausting the gas through each of the exhaust ports;
   a first switching unit for selectively switching the communication between one of the first and second pipes and the gas supply system;
   a second switching unit for selectively switching the communication between either a pair of the first and second exhaust ports or a pair of the third and fourth exhaust ports, and the exhaust system; and
   a control section connected to the first and second switching units, for alternately switching a first connection state for flowing the gas from the first pipe to the first exhaust port with a second connection state for flowing the gas from the first pipe to the second exhaust port, and for alternately switching a third connection state for flowing the gas from the second pipe to the third exhaust port with a fourth connection state for flowing the gas from the second pipe to the fourth exhaust port as well as for alternately switching a first and second connection state with the second switching means.

2. An heat treatment apparatus comprising:
   a chamber;
   a hot plate for supporting and heating a substrate in the chamber;
   an exhaust mechanism having a single or a plurality of exhaust ports for exhausting a gas in a direction substantially parallel to a main surface of the substrate placed on the hot plate;
   a gas supply mechanism facing the exhaust ports with the hot plate interposed therebetween and having gas blow-out ports whose total length involved in blowing out of the gas is greater than that of the exhaust ports; and
   an air board for guiding the gas blown out from the gas brow-out ports to the exhaust ports.

3. The apparatus according to claim 2, wherein the air board consists of
   a first board member extended from an end of an array of gas blow-out ports to an end of an array of the exhaust ports, and
   a second board member extended from the other end of the array of the gas blow-out ports and the other end of the array of the exhaust ports.

4. The apparatus according to claim 2, further comprising:
   a sensor for detecting temperature of the hot plate; and
   control means for controlling at least one of the gas supply mechanism and the exhaust mechanism on the basis of the temperature detected by the sensor.

5. The apparatus according to claim 2, further comprising gas flow-rate changing means for changing a flow rate of the gas blown out from the gas blow-out ports.

6. The apparatus according to claim 5, wherein the gas flow-rate changing means has
   an opening diameter control means for controlling an opening diameter of the gas flow-out port;
   a sensor for detecting temperature of the hot plate; and
   control means for controlling the opening diameter control means on the basis of the temperature detected by the sensor.

7. The apparatus according to claim 2, further comprising gas blow-out angle changing means for changing an angle of blowing out the gas blown out from the gas blow-out ports.

8. The apparatus according to claim 7, wherein
   the gas blow-out changing means has
   angle control means for controlling an angle of the gas blow-out ports,
   a sensor for detecting temperature of the hot plate; and
   control means for controlling the angle control means on the basis of the temperature detected by the sensor.

9. A substrate processing system comprising:
   a chamber;
   a hot plate for supporting and heating a substrate in the chamber;
   an exhaust mechanism having a single or a plurality of exhaust ports for exhausting a gas substantially in parallel with a main surface of the substrate placed on the hot plate;
   a gas supply mechanism facing the exhaust ports with the hot plate interposed therebetween and having a gas blow-out ports whose total length involved in blowing out of the gas is greater than that of the exhaust ports;
   a housing having triangular-prism corner assemblies each having a triangular bottom surface whose apex corresponds to the exhaust port and whose bottom line corresponds to the gas blow-out ports, for surrounding the hot plate;
   a plurality of heat treatment units symmetrically arranged in the housing;
   a main arm mechanism surrounded by the heat treatment units, for transporting the substrate to each of the heat treatment units; and
   control means for controlling the main arm mechanism and the heat treatment units, independently.

10. The substrate processing system according to claim 9, wherein
    the heat treatment units consist of four units each being arranged at a corner of the chamber in a plan view.

11. The substrate processing system according to claim 9, wherein a most inner part of each of the corner assemblies is formed with a right angle in a plan view and the exhaust port is arranged in the most inner part.

* * * * *